(12) United States Patent
Lai et al.

(10) Patent No.: US 8,946,671 B2
(45) Date of Patent: Feb. 3, 2015

(54) MASK READ ONLY MEMORY CONTAINING DIODES AND METHOD OF MANUFACTURING THE SAME

(75) Inventors: Sheng-Chih Lai, Taichung (TW);
Hsiang-Lan Lung, Hsinchu (TW);
Yi-Chou Chen, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 1495 days.

(21) Appl. No.: 10/642,244

(22) Filed: Aug. 18, 2003

(65) Prior Publication Data

US 2005/0073010 A1    Apr. 7, 2005

(30) Foreign Application Priority Data

Nov. 11, 2002  (TW) ............................... 91133003 A

(51) Int. Cl.
*H01L 47/00* (2006.01)
*H01L 27/102* (2006.01)
*H01L 21/822* (2006.01)
*H01L 27/06* (2006.01)

(52) U.S. Cl.
CPC ........ *H01L 27/1021* (2013.01); *H01L 21/8221* (2013.01); *H01L 27/0688* (2013.01)

USPC .............................................. 257/4

(58) Field of Classification Search
CPC ............ H01L 27/1021; H01L 27/0688; H01L 21/8221
USPC ............................... 438/257; 257/4
See application file for complete search history.

(56) References Cited

U.S. PATENT DOCUMENTS

| | | | |
|---|---|---|---|
| 5,441,907 A | 8/1995 | Sung et al. | 438/237 |
| 6,185,122 B1 | 2/2001 | Johnson et al. | 365/103 |
| 6,525,953 B1 * | 2/2003 | Johnson | 365/63 |
| 6,770,939 B2 * | 8/2004 | Subramanian et al. | 257/368 |

FOREIGN PATENT DOCUMENTS

| | | |
|---|---|---|
| JP | 1-189958 A | 7/1989 |
| JP | 02-021651 A | 1/1990 |
| JP | 2-090673 A | 3/1990 |
| JP | 4-042570 A | 2/1992 |
| JP | 06-334139 | 12/1994 |

* cited by examiner

*Primary Examiner* — William D Coleman

(74) *Attorney, Agent, or Firm* — Birch, Stewart, Kolasch & Birch, LLP

(57) ABSTRACT

A mask read only memory containing diodes and method of manufacturing the same. The mask read only memory is a high-density three dimensional array formed by stacking a plurality of diode layers and the logic "0" or "1" is defined by whether there is a dielectric layer on the diode.

12 Claims, 29 Drawing Sheets

MASK READ ONLY MEMORY CONTAINING DIODES AND METHOD OF MANUFACTURING THE SAME

This nonprovisional application claims priority under 35 U.S.C. § 119 (a) on Patent Application No. 091133003 filed in Taiwan on Nov. 11, 2002, which is herein incorporated by reference.

BACKGROUND OF THE INVENTION

1. Field of the Invention

The present invention relates to a mask read only memory containing diodes, and in particular to a mask read only memory in which the logic "0" or "1" is defined by whether there is a dielectric layer on the diode.

2. Description of the Related Art

Nonvolatile memories are classified into mask read only memories (Mask ROM) and field programmable memories. In a conventional Mask ROM device, memory units are formed from metal-oxide-semiconductor transistors and the memory is programmed using ion implantation to regulate the threshold voltage of part of the MOS transistors, and thereby code logic into "0" and "1".

In recent years, there has been a mask ROM using vertical PN diodes in memory cells. For example, U.S. Pat. No. 5,441,907 discloses a Mask ROM containing PN vertical diodes, wherein logic "0" and "1" are defined by whether there is a PN diode.

U.S. Pat. No. 6,185,122 B1 discloses a ROM containing PN diodes, which is a one time programmable read only memory and not a mask ROM. After the memory is manufactured, there is an oxide layer on the PN diode. The memory stores data of logic "0" and "1" by means of breaking down the oxide layer using high voltage energy, wherein the location that is broken down is defined as logic "1" and the location that is not broken down is defined as logic "0". However, when the thickness of the oxide layer is not uniform, the definition is hindered.

SUMMARY OF THE INVENTION

Accordingly, an object of the invention is to provide a mask read only memory containing diodes and a method of manufacturing the same, wherein logic "0" and "1" are defined by whether there is a dielectric layer on the diode and the mask read only memory is a high-density three dimensional array formed by stacking a plurality of diode layers.

To achieve the object of the present invention, the mask read only memory containing diodes of the present invention comprises a semiconductor substrate; an insulating layer on the semiconductor substrate; a plurality of first conductive lines along a first direction on the insulating layer; a plurality of vertical diodes on the first conductive lines; a plurality of dielectric layers on part of the diodes; and a plurality of second conductive lines along a second direction on the dielectric layers and the diodes, wherein the first direction is perpendicular to the second direction.

According to an embodiment of the present invention, the mask read only memory containing diodes of the present invention comprises a semiconductor substrate; an insulating layer on the semiconductor substrate; and at least two memory cell layers stacked on the insulating layer wherein there is a separating layer between any two memory cell layers to provide insulation and wherein each memory cell layer comprises a plurality of first conductive lines along a first direction on the insulating layer; a plurality of vertical diodes on the first conductive lines; a plurality of dielectric layers on part of the diodes; and a plurality of second conductive lines along a second direction on the dielectric layers and the diodes, wherein the first direction is perpendicular to the second direction, wherein any two adjacent upper and lower diode layers are disposed opposite to one another so that two sides thereof of the opposing conductive types face each other.

The quantity of the aforementioned memory cell is layers may be 2 to 10 layers. The separating layer may be silicon dioxide.

According to another embodiment of the present invention, the mask read only memory containing diodes of the present invention comprises a semiconductor substrate; an insulating layer on the semiconductor substrate; n diode layers stacked on the insulating layer, wherein n is an integer equal to or more than 2 and each diode layer comprises a plurality of vertical diodes and a plurality of dielectric layers on part of the diodes; and (n+1) parallel conductive layers disposed between the bottom diode layer and the insulating layer, on the top diode layer, and between any two adjacent diode layers respectively, wherein the (n+1) parallel conductive layers are disposed so that any two adjacent conductive layers are perpendicular to each other, wherein any two adjacent upper and lower diode layers are disposed opposite to one another so that two sides of matching conductive type face each other.

The quantity of the aforementioned diode layers may be 2 to 10 layers.

The present invention also provides a method of manufacturing the mask read only memory containing diodes. According to an embodiment of the present invention, the manufacturing method may comprise the steps of forming an insulating layer, a first conductive layer, a second conductive layer and a third conductive layer on a semiconductor substrate in order, wherein a PN junction or Schottky interface is formed between the second and the third conductive layers; patterning the third, the second and the first conductive layers, thereby forming a plurality of first trenches along a first direction to define the first conductive layer as a plurality of bit lines; filling a first insulating material into the first trenches; forming a dielectric layer on the entire surface of the third conductive layer and the first insulating material; patterning the dielectric layer, the first insulating material, the third conductive layer and the second conductive layer and stopping the patterning at the bit lines, thereby forming a plurality of second trenches along a second direction and forming a plurality of diodes comprising the second conductive layer and the third conductive layer, wherein the first direction is perpendicular to the second direction; filling a second insulating material into the second trenches so that the top of the second insulating material is higher than that of the dielectric layer, thereby forming a plurality of third trenches along the second direction; patterning the dielectric layer to expose part of the third conductive layer of the diode, thereby forming a plurality of openings for coding defined as a plurality of codes; forming a fourth conductive layer filled into the third trenches and the openings for coding, thereby forming a plurality of word lines.

According to another embodiment of the present invention, the manufacturing method may comprise the steps of forming an insulating layer, a first conductive layer, a second conductive layer, a third conductive layer, and a first dielectric layer on a semiconductor substrate in order, wherein a PN junction or Schottky interface is formed between the second and the third conductive layers; patterning the first dielectric layer to expose part of the third conductive layer, thereby forming a plurality of first openings for coding defined as a plurality of first codes; patterning the first dielectric layer, the third conductive layer, the second conductive layer and the first conductive layer, thereby forming a plurality of first trenches along a first direction to define the first conductive layer as a plurality of first bit lines; filling a first insulating material into the first trenches; forming a fourth conductive layer on the surface of the entire substrate and the first openings for coding are filled with the material of the fourth conductive layer; forming a fifth conductive layer, a sixth conductive layer and a second dielectric layer on the fourth conductive layer in order, wherein a PN junction or Schottky interface between the fifth and the sixth conductive layers is formed; patterning the second dielectric layer to expose part of the sixth conductive layer, thereby forming a plurality of second openings for coding defined as a plurality of second codes; patterning the second dielectric layer, the sixth conductive layer, the fifth conductive layer, the fourth conductive layers, the first dielectric layer, the third conductive layer, and the second conductive layer, and stopping the patterning at the first bit lines, thereby forming a plurality of second trenches along a second direction to define the fourth conductive layer as a plurality of first word lines, wherein the first direction is perpendicular to the second direction; filling a second insulating material into the second trenches; forming a seventh conductive layer on the surface of the entire substrate and the second openings for coding are filled with the material of the seventh conductive layer; forming an eighth conductive layer, a ninth conductive layer and a third dielectric layer on the seventh conductive layer in order, wherein a PN junction or Schottky interface between the eighth and the ninth conductive layers is formed; patterning the third dielectric layer to expose part of the ninth conductive layer, thereby forming a plurality of third openings for coding defined as a plurality of third codes; patterning the third dielectric layer, the ninth conductive layer, the eighth conductive layer, the seventh conductive layer, the second dielectric layer, the sixth conductive layer and the fifth conductive layer, and stopping the patterning at the first word lines, thereby forming a plurality of third trenches along the first direction to define the seventh conductive layer as a plurality of second bit lines; filling a third insulating material into the third trenches; patterning the third dielectric layer, the ninth conductive layer and the eighth conductive layer and stopping the patterning at the second bit lines, thereby forming a plurality of fourth trenches along the second direction; filling a fourth insulating material into the fourth trenches so that the top of the fourth insulating material is higher than that of the third dielectric layer, thereby forming a plurality of the fifth trenches along the second direction; and filling a tenth conductive layer into the fifth trenches, thereby forming a plurality of second word lines, wherein the third and the fifth conductive layers are of matching conductive type and the sixth and the eighth conductive layers are of matching conductive type.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not liitative of the present invention, and wherein:

FIG. 1a to 1l are three dimensional schematic views showing the manufacturing process of the mask read only memory containing PN diodes according to a preferred embodiment of the present invention, which contains a PN diode layer;

DETAILED DESCRIPTION OF THE INVENTION

FIGS. 1a to 1l are cross-section schematic views showing the manufacturing process of the mask read only memory containing diodes according to a preferred embodiment of the present invention.

Figure 1A:
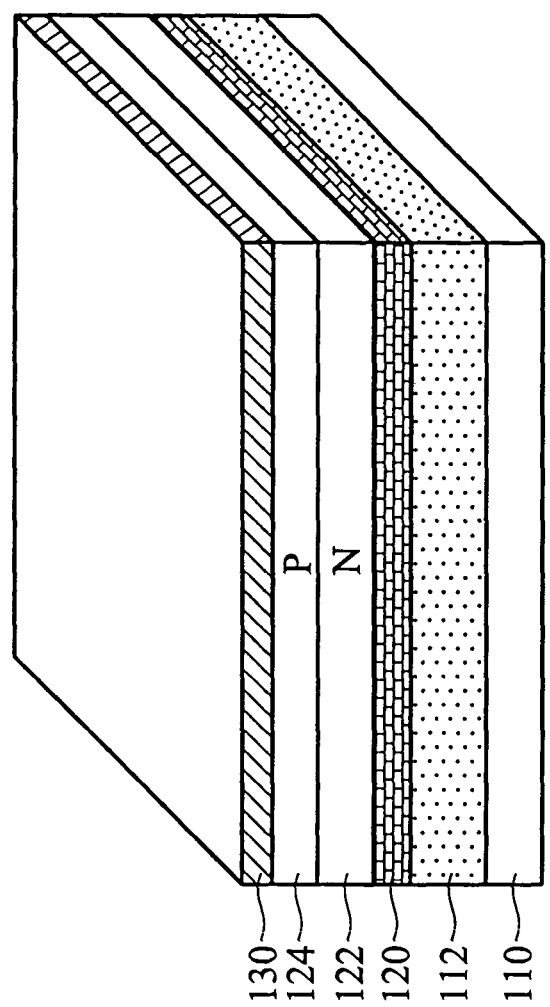

Referring to FIG. 1a, an insulating layer 112, a first conductive layer 120, a second conductive layer 122, a third conductive layer 124 and a first shielding layer 130 are formed on a semiconductor substrate 110 in order. The insulating layer 112 may be silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$). For example, the insulating layer 112 may be silicon dioxide with a thickness of 500 to 800 nm formed by chemical vapor deposition (CVD). The first conductive layer 120 may be polysilicon formed by CVD or a metal layer formed by sputtering, with a thickness of 200 to 400 nm. The first shielding layer 130 may be silicon nitride formed by CVD, with a thickness of 50 to 300 nm.

A PN junction or Schottky interface is formed between the second conductive layer 122 and the third conductive layers 124. For example, the second conductive layer 122 may be N-type polysilicon formed by CVD or plasma-enhanced CVD (PECVD) and doped with arsenic (As), phosphorus (P), or other N-type dopants, with a thickness of 100 to 600 nm. The third conductive layer 124 may be P-type polysilicon formed by CVD or PECVD and doped with boron (B), gallium (Ga), indium (In), or other P-type dopants, with a thickness of 100 to 400 nm. Thus, a PN junction is formed between the second conductive layer 122 and the third conductive layer 124. Alternatively, the second conductive layer 122 can be P-type polysilicon and the third conductive layer 124 can be metal, so that a Schottky interface is formed therebetween. For convenience, the second conductive layer 122 shown in the figure is represented by N (standing for N-type polysilicon), and the third conductive layer 124 shown in the figure is represented by P (standing for P-type polysilicon).

Figure 1B:
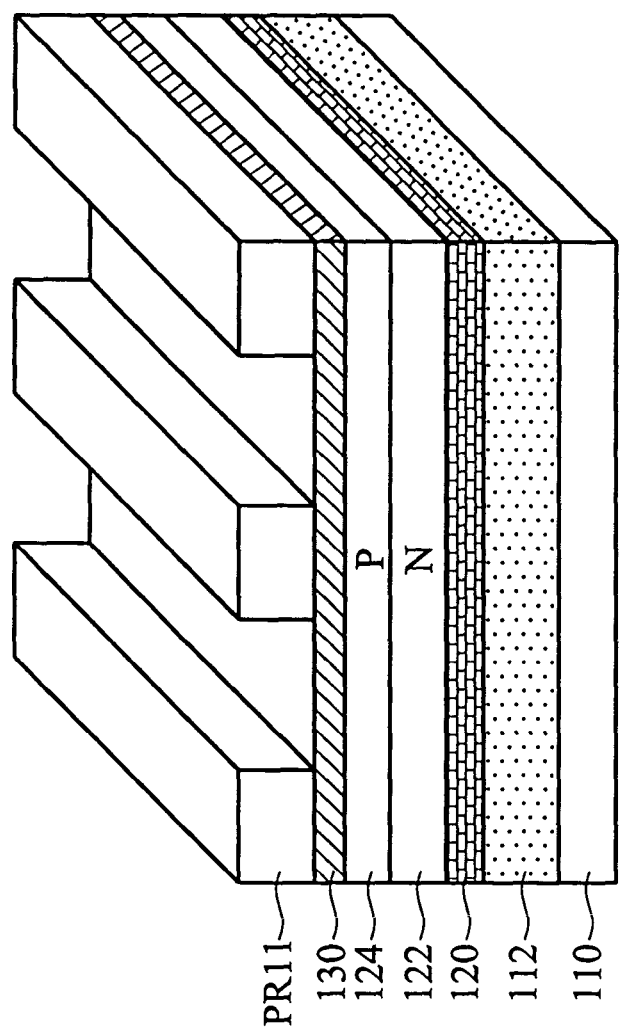

Next, referring to FIG. 1b, a first patterned photoresist PR11 is formed on the first shielding layer 130, with a pattern as same as that of bit lines to be formed.

Figure 1C:
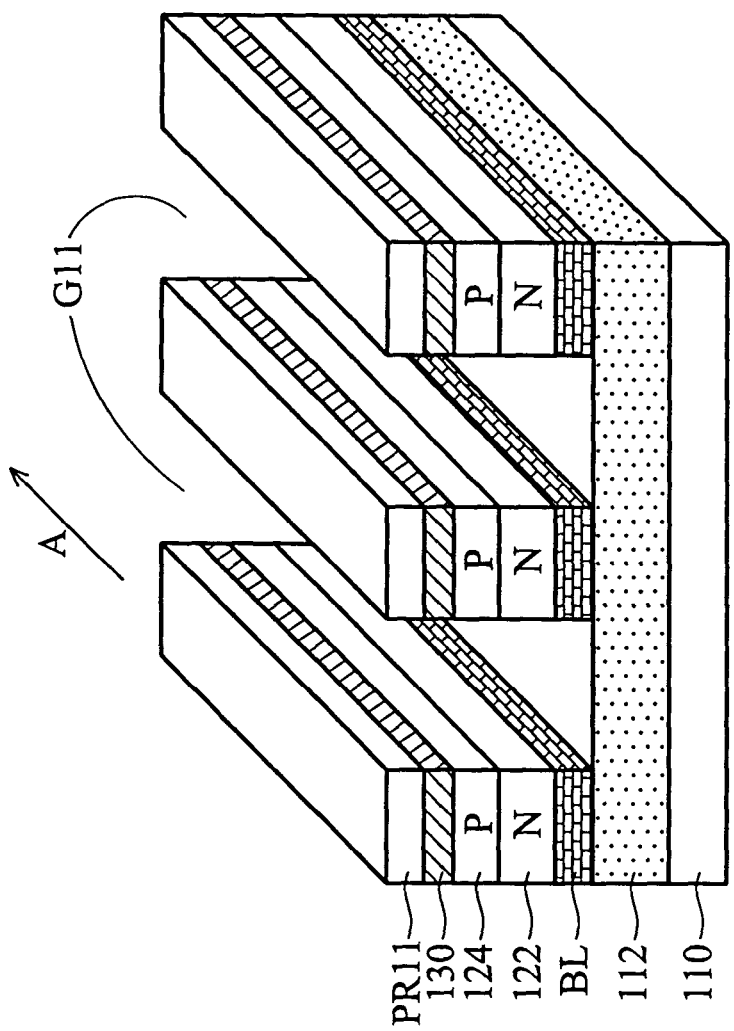

Next, referring to FIG. 1c, the first shielding layer 130, the third conductive layer 124, the second conductive layer 122 and the first conductive layer 120 are etched using the first patterned photoresist PR11 as a mask, and the etching is stopped at the insulating layer 112 to form a plurality of first trenches G11 along a first direction A. The first conductive layer 120 is defined as a plurality of bit lines BL. The etching may be reactive ion etching (RIE).

Figure 1D:
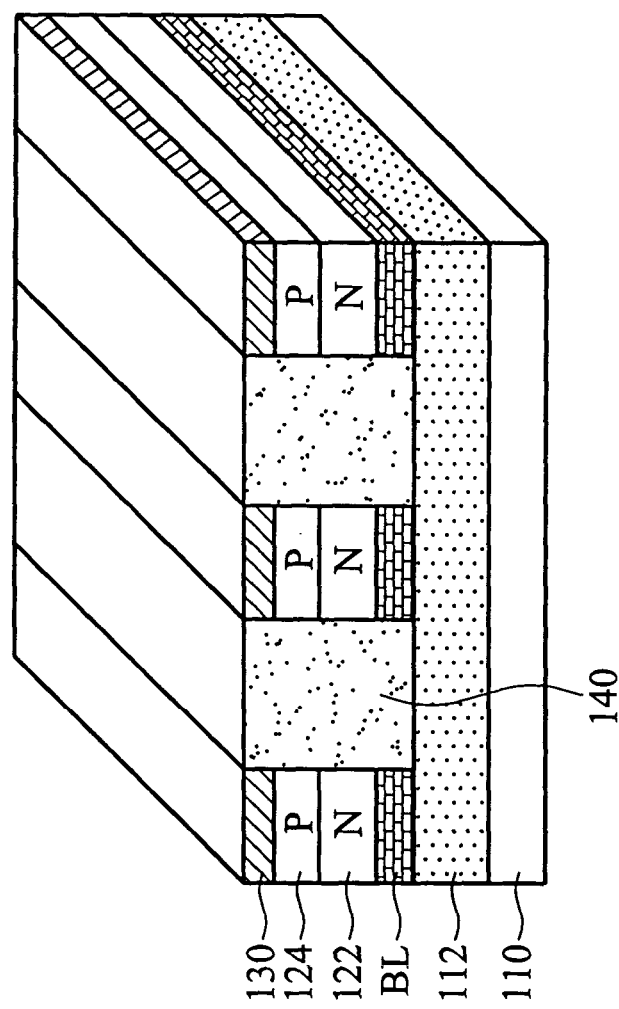

Next, referring to FIG. 1d, the patterned first photoresist PR11 is removed, and a first insulating material 140 is filled into the first trenches G11. For example, silicon dioxide 140 is formed and filled into the first trenches G11 by high density plasma CVD (HDPCVD). Then, the first insulating material 140 is etched back using the first shielding layer 130 as a stop layer.

Figure 1E:
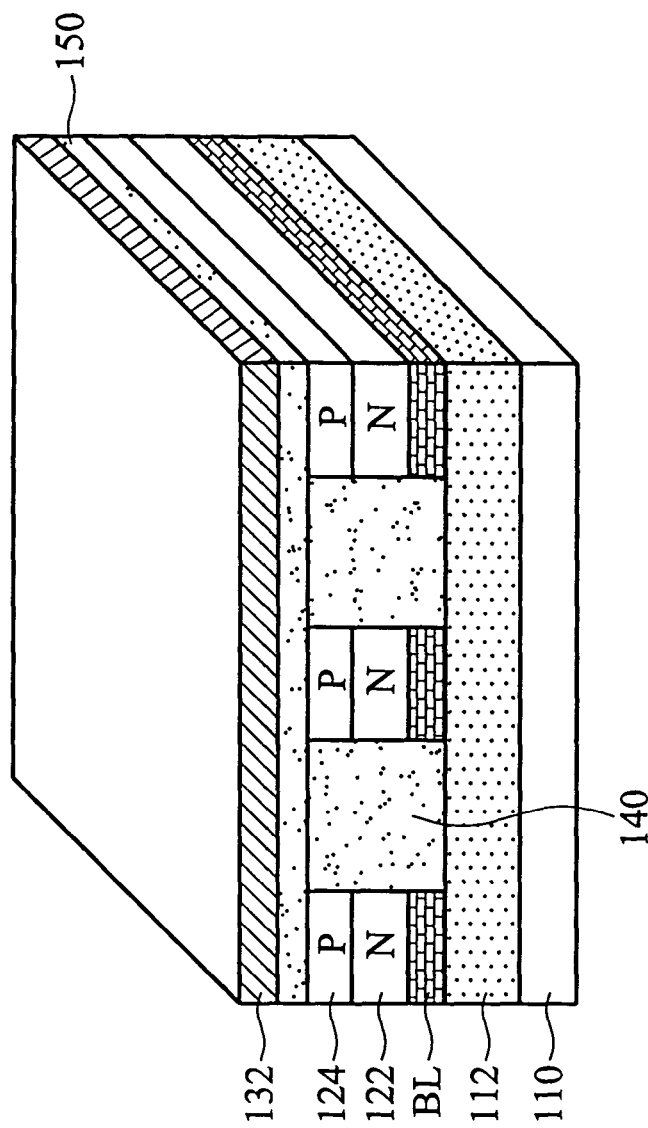

Next, referring to FIG. 1e, the first shielding layer 130 is removed, and, then, a dielectric layer 150 is formed on the entire surface of the third conductive layer 124 and the first insulating material 140. Subsequently, a second shielding layer 132 is formed on the entire surface. The dielectric layer 150 may be silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$). For example, the dielectric layer 150 can be silicon dioxide formed by CVD. The second shielding layer 132 can be silicon nitride formed by CVD.

Figure 1F:
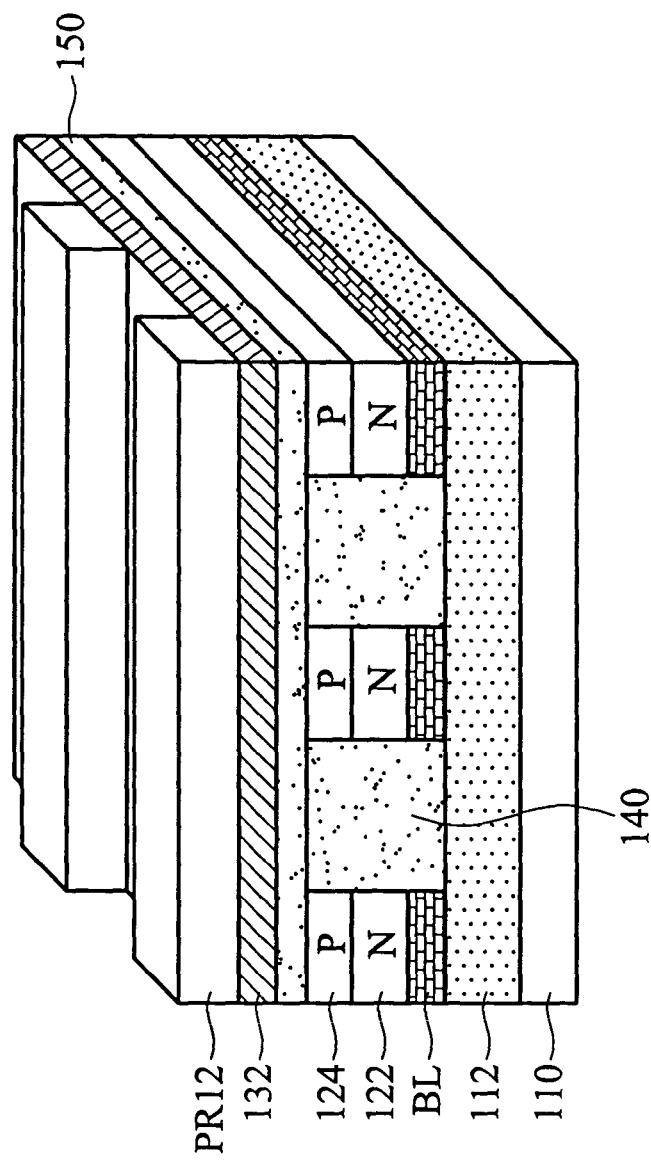

Next, referring to FIG. 1f, a second patterned photoresist PR12 is formed on the second shielding layer 132, with a pattern the same as that of the word lines to be formed.

Figure 1G:
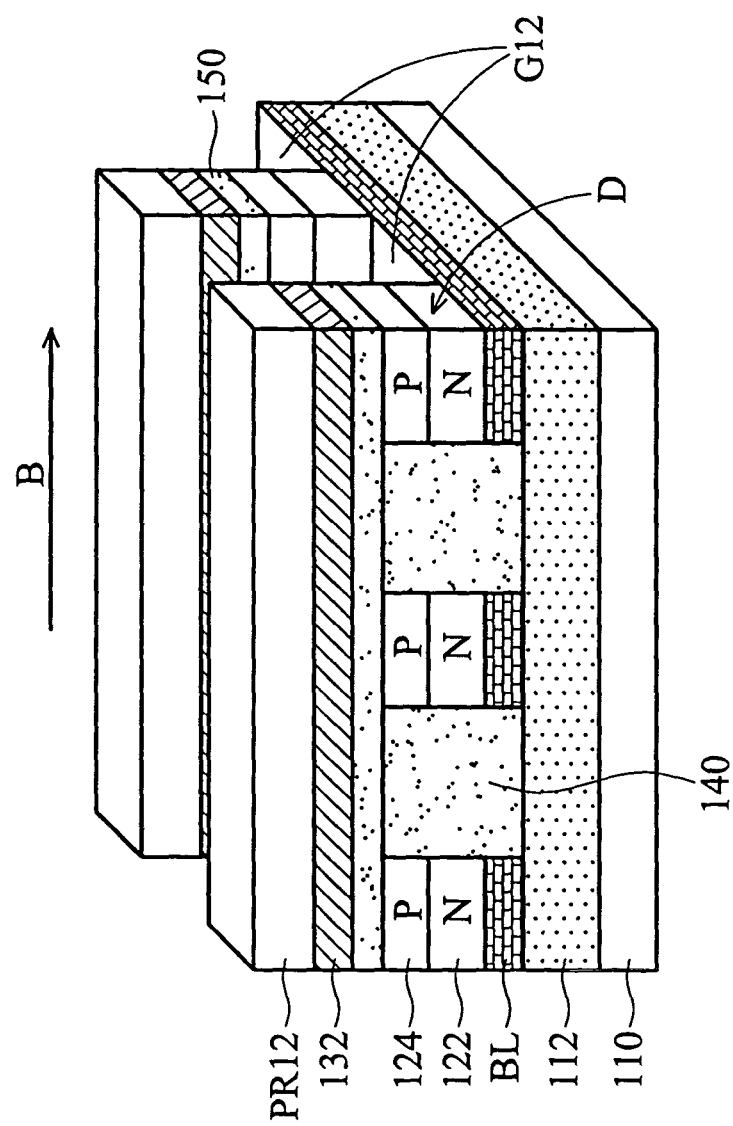

Next, referring to FIG. 1g, the second shielding layer 132, the dielectric layer 150, the first insulating material 140, the third conductive layer 124 and the second conductive layer 122 are etched using the second patterned photoresist PR12 as a mask, and the etching is stopped at the bit lines BL, thereby forming a plurality of second trenches G12 along a second direction B perpendicular to the first direction A. Accordingly, the third conductive layer 124 and the second conductive layer 122 are divided into a plurality of diodes D. In the figure, diodes D are represented by PN diodes, the third conductive layer 124 is represented by P, and the second conductive layer 122 is represented by N.

Figure 1H:
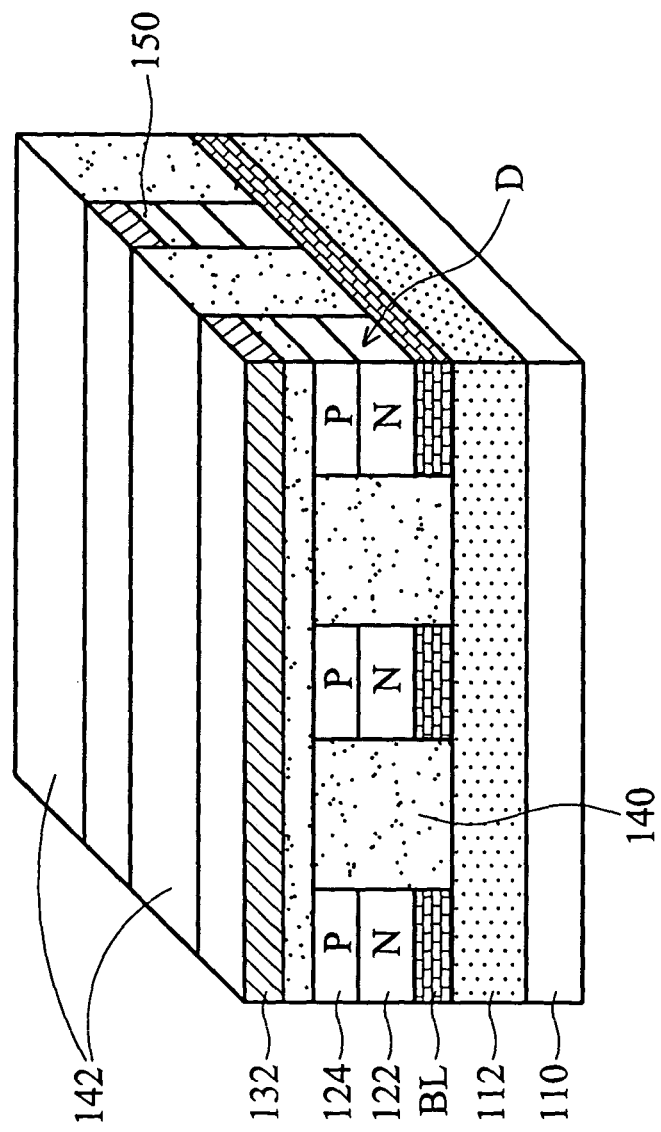

Next, referring to FIG. 1h, the patterned second photoresist PR12 is removed, and a second insulating material 142 is filled into the second trenches G12. For example, silicon dioxide 142 is formed and filled into the second trenches G12 by HDPCVD. Then, the second insulating material 142 is etched back using the second shielding layer 132 as a stop layer.

Figure 1I:
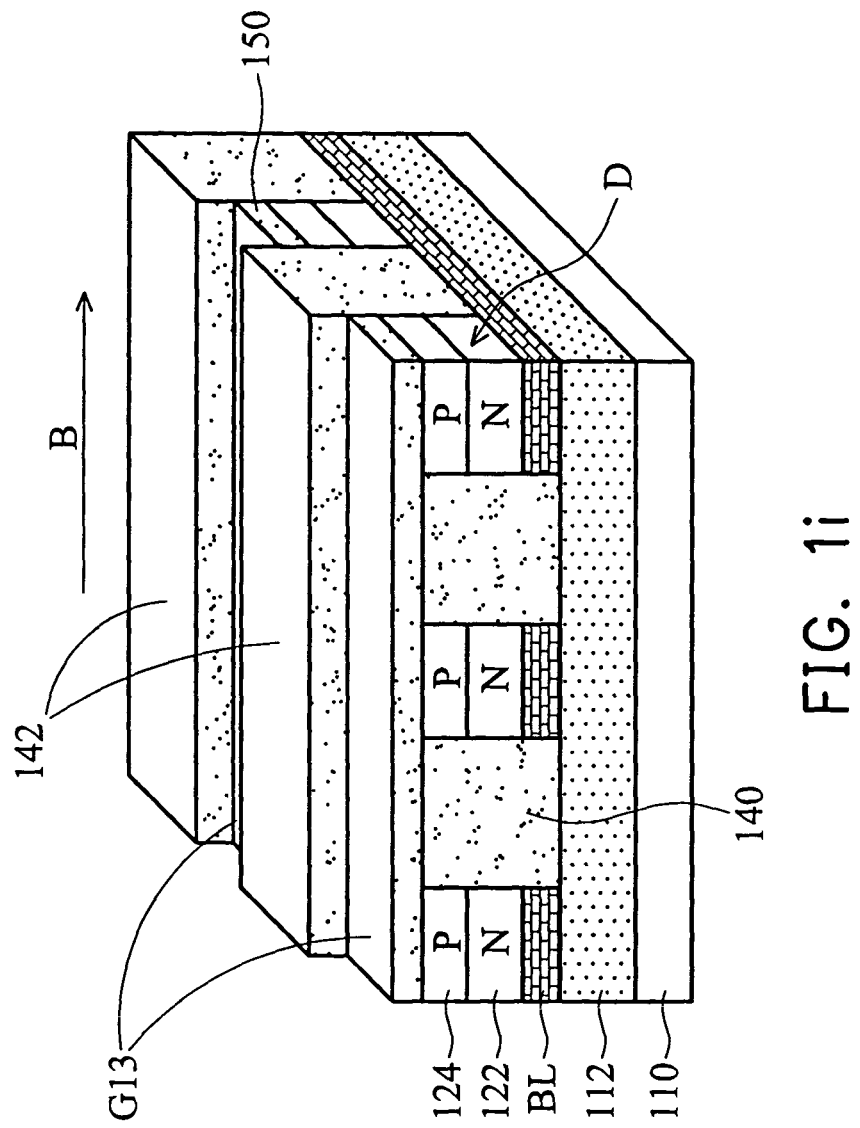

Next, referring to FIG. 1i, the second shielding layer 132 is removed, to form a plurality of third trenches G13 along the direction B, so that the top of the second insulating material 142 is higher than that of the dielectric layer 150.

Figure 1J:
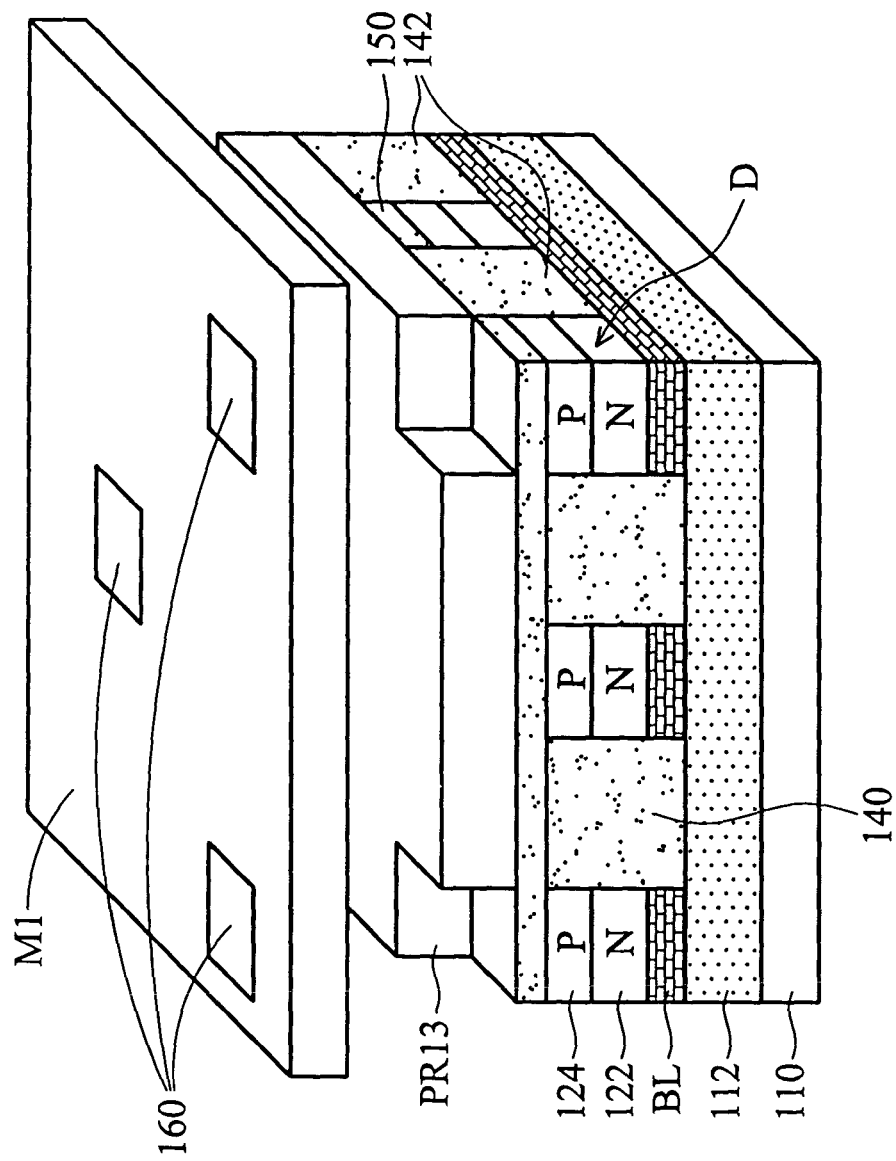

Next, referring to FIG. 1j, a third photoresist PR13 is formed and subjected to exposure and development through a ROM code mask Ml for patterning. The openings on the ROM code mask Ml are ROM codes 160.

Figure 1K:
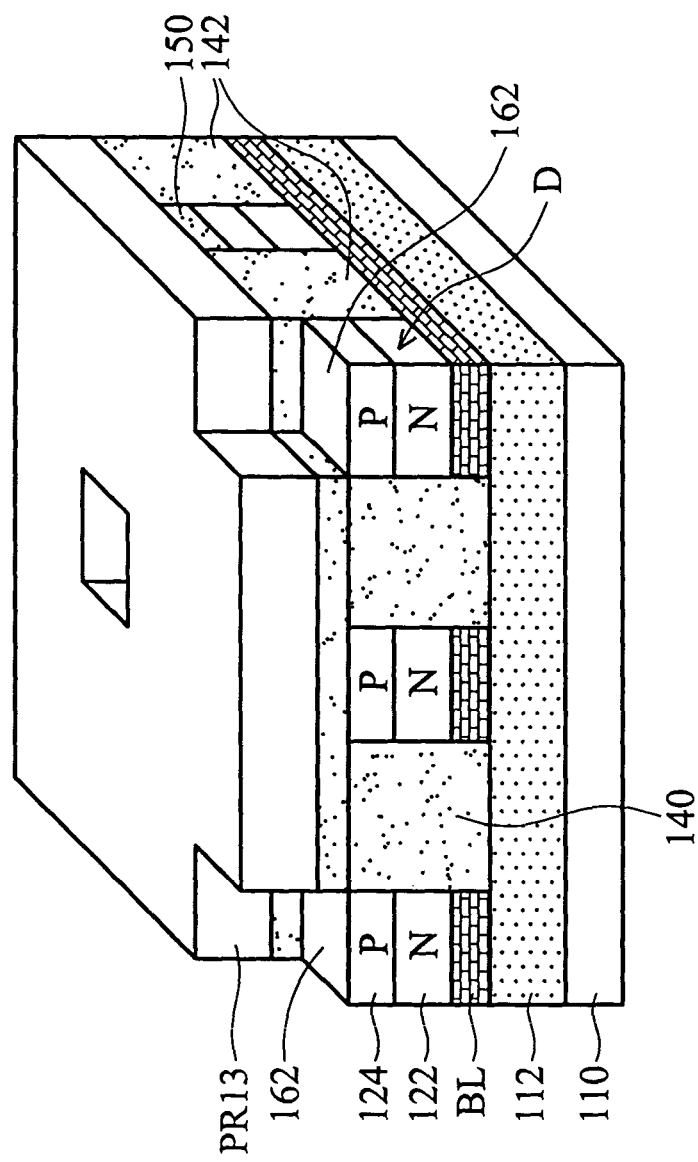
Figure 1I:
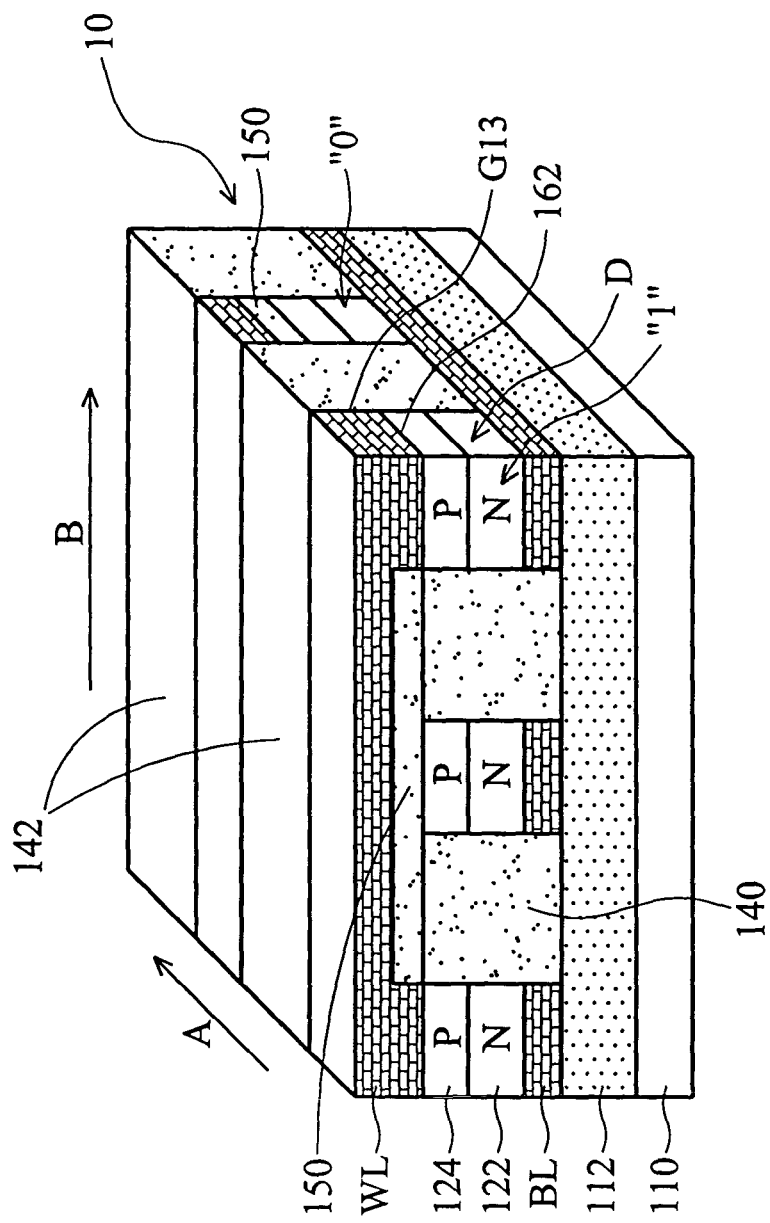

Next, referring to FIG. 1k, the dielectric layer 150 at the codes 160 is etched using the third patterned photoresist PR13 as a mask to expose the third conductive layer 124 of diodes D at the codes 160 to form a plurality of openings for coding 162. The etching may be RIE.

Next, referring to FIG. 1l, the third patterned photoresist PR13 is removed, a fourth conductive layer is formed and filled into the third trenches G13 and the openings for coding 162, and, then, chemical mechanical polishing (CMP) is performed to form a plurality of word lines WL. The word lines WL are formed by self-alignment without a mask. Accordingly, a mask read only memory containing diodes is accomplished, which has a memory cell layer 10. The memory cell layer 10 is constructed by the structure created by the bit lines BL to the word lines WL, that is, the memory cell layer 10 includes a plurality of the bit lines BL along the direction A; a plurality of the vertical diodes D on the bit lines BL; a plurality of the dielectric layers 150 on part of the diodes D; and a plurality of the word lines WL along the direction B on the dielectric layers 150 and the diodes D. The diode D having the dielectric layer 150 thereon is defined as logic "0" and the diode D without the dielectric layer 150 thereon is defined as logic "1".

Figure 2:
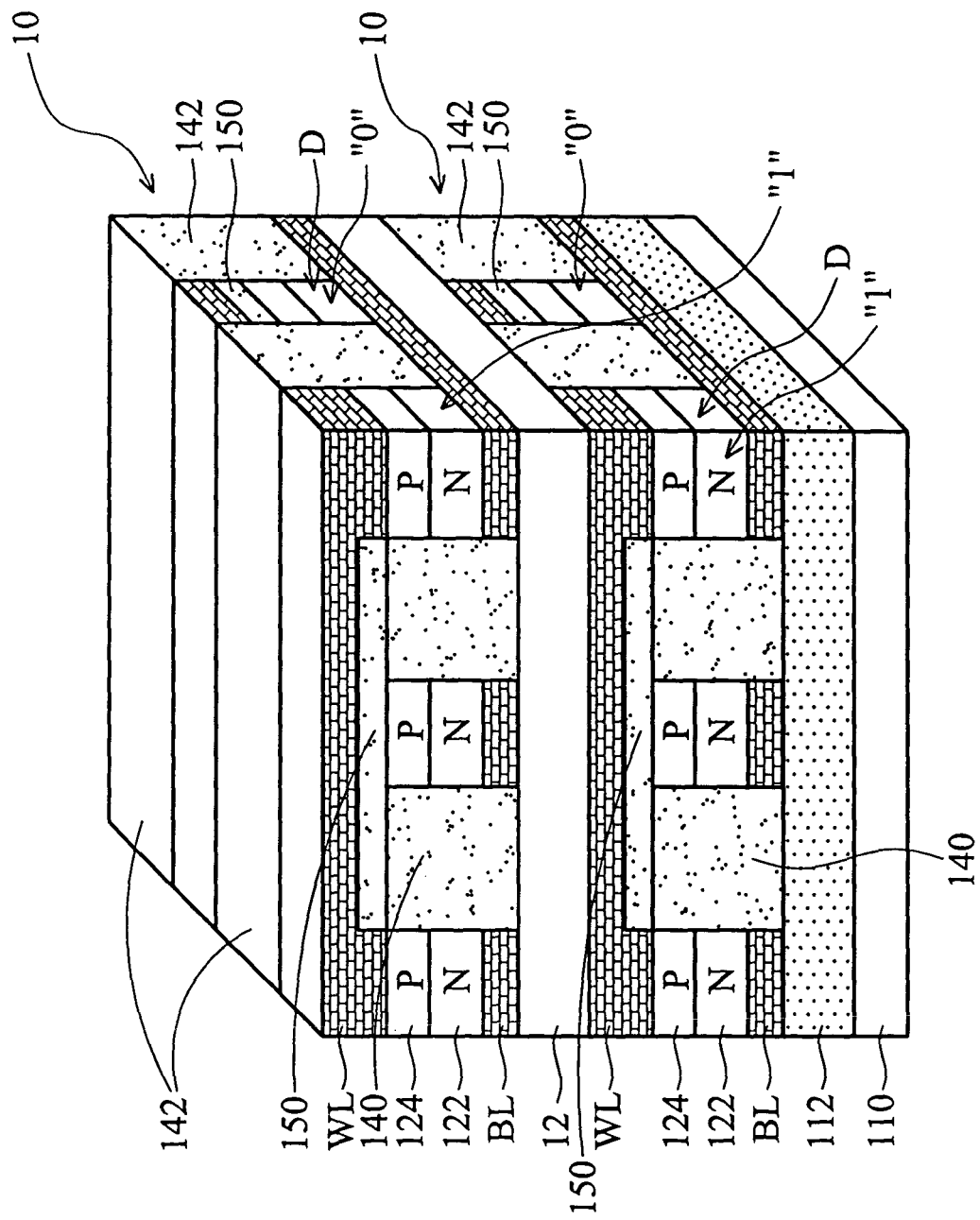
FIG. 2 is a three dimensional schematic view showing the manufacturing process of the mask read only memory containing PN diodes according to a preferred embodiment of the present invention, which contains two PN diode layers.

Furthermore, a plurality of memory cell layers 10 may be stacked to form a three-dimensional array in the present invention. For example, FIG. 2 shows a mask read only memory containing diodes D, which has two memory cell layers 10 separated by a separating layer 12 to provide insulation. The separating layer 12 may be silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$). Additionally, the diode D having the dielectric layer 150 thereon is defined as logic "0" and the diode D without the dielectric layer 150 thereon is defined as logic "1". The reference numbers in FIG. 2 which are same as those in FIG. 1 represent the same elements.

Figure 3A:
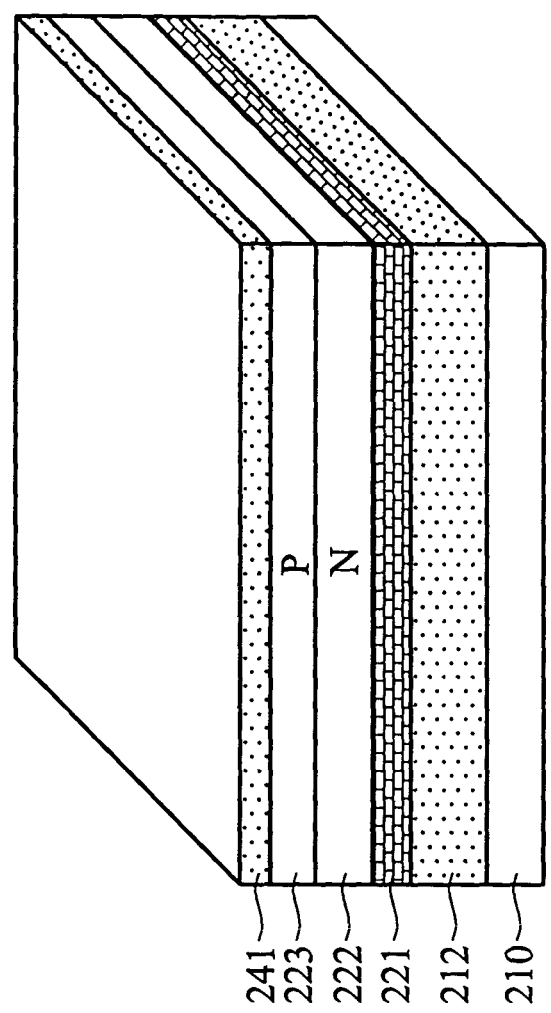
FIG. 3a to 3o are three dimensional schematic views showing the manufacturing process of the mask read only memory containing PN diodes according to another preferred embodiment of the present invention, which contains three PN diode layers.
Figure 3B:
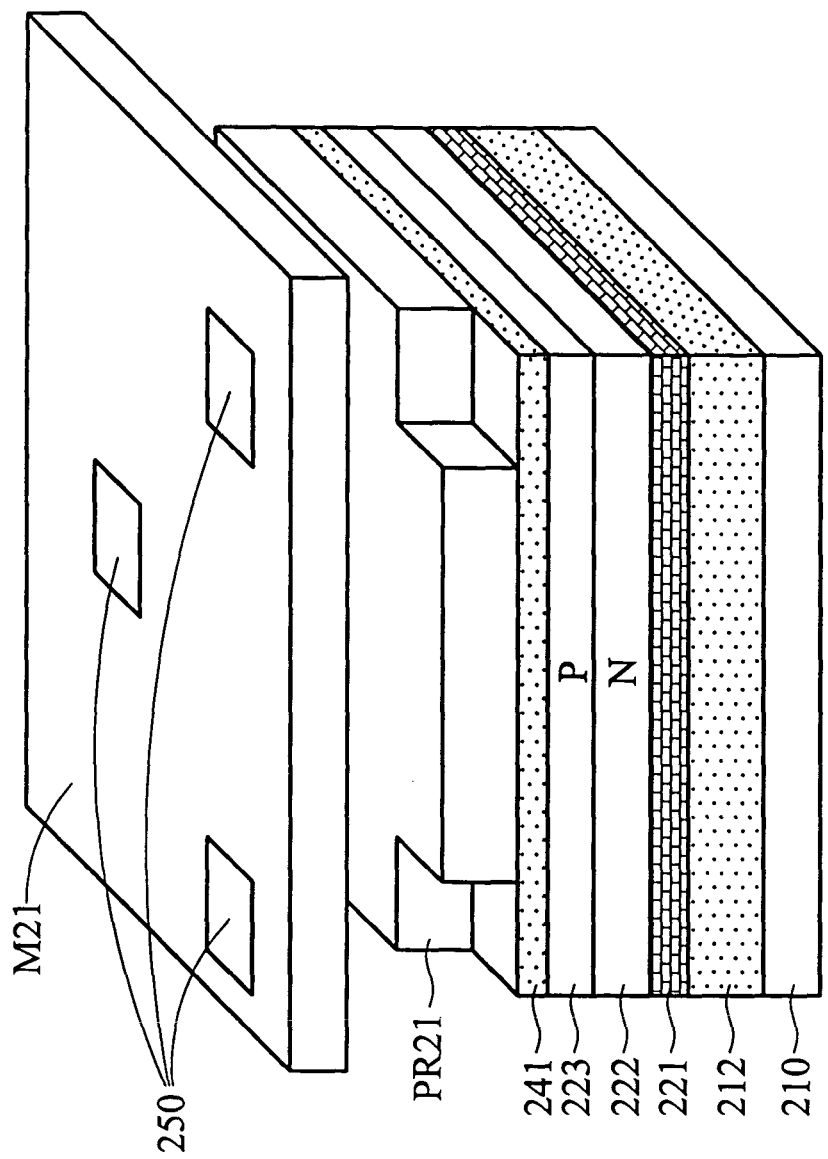
Figure 3C:
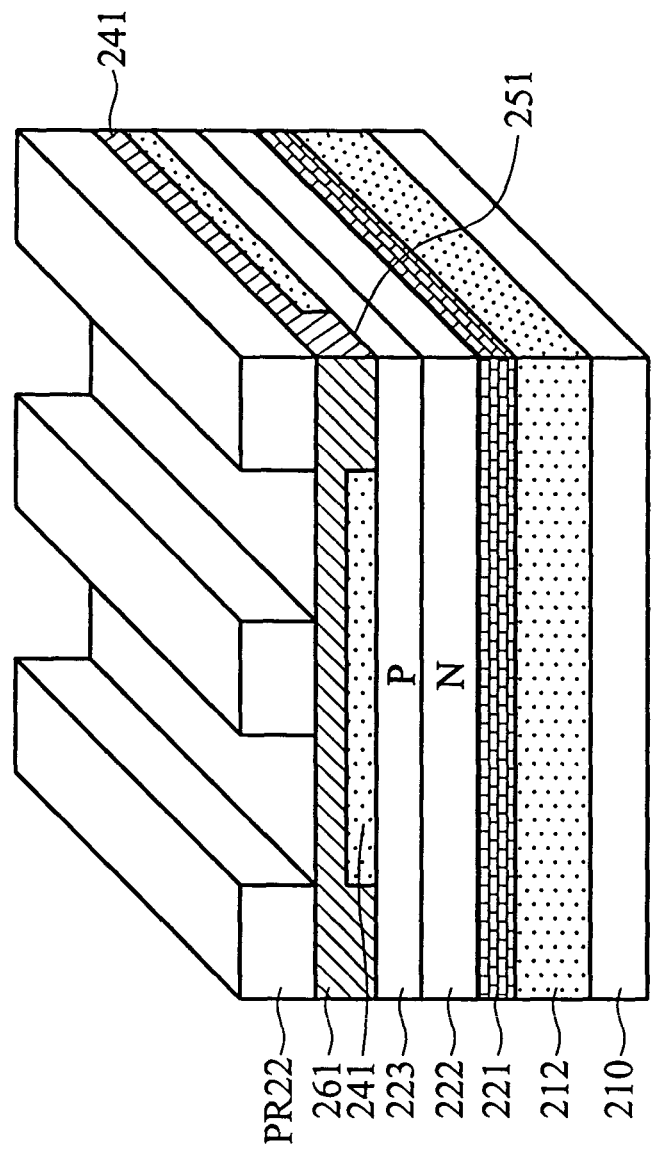
Figure 3D:
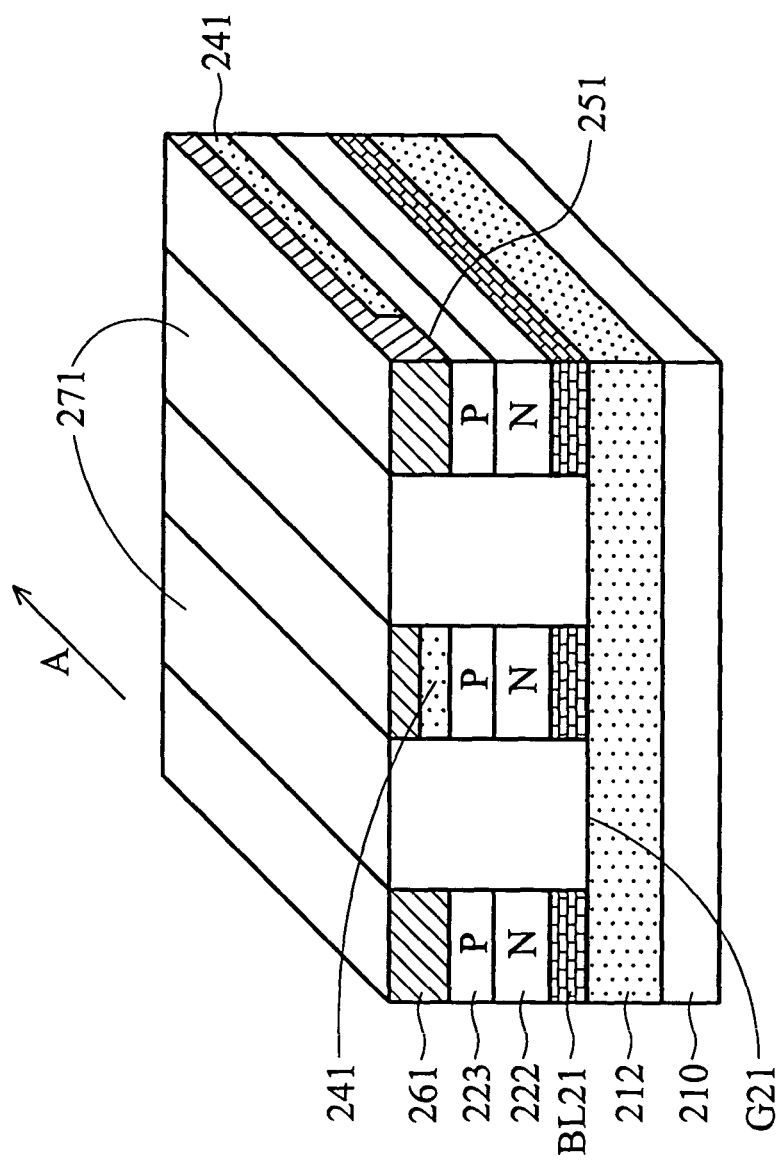
Figure 3E:
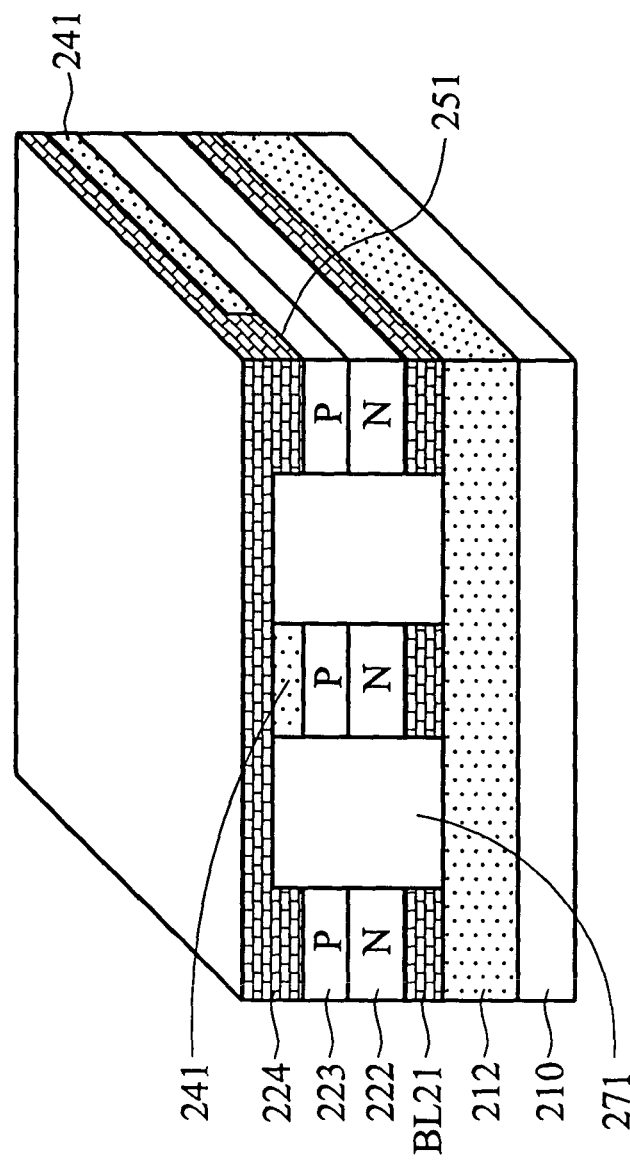
Figure 3F:
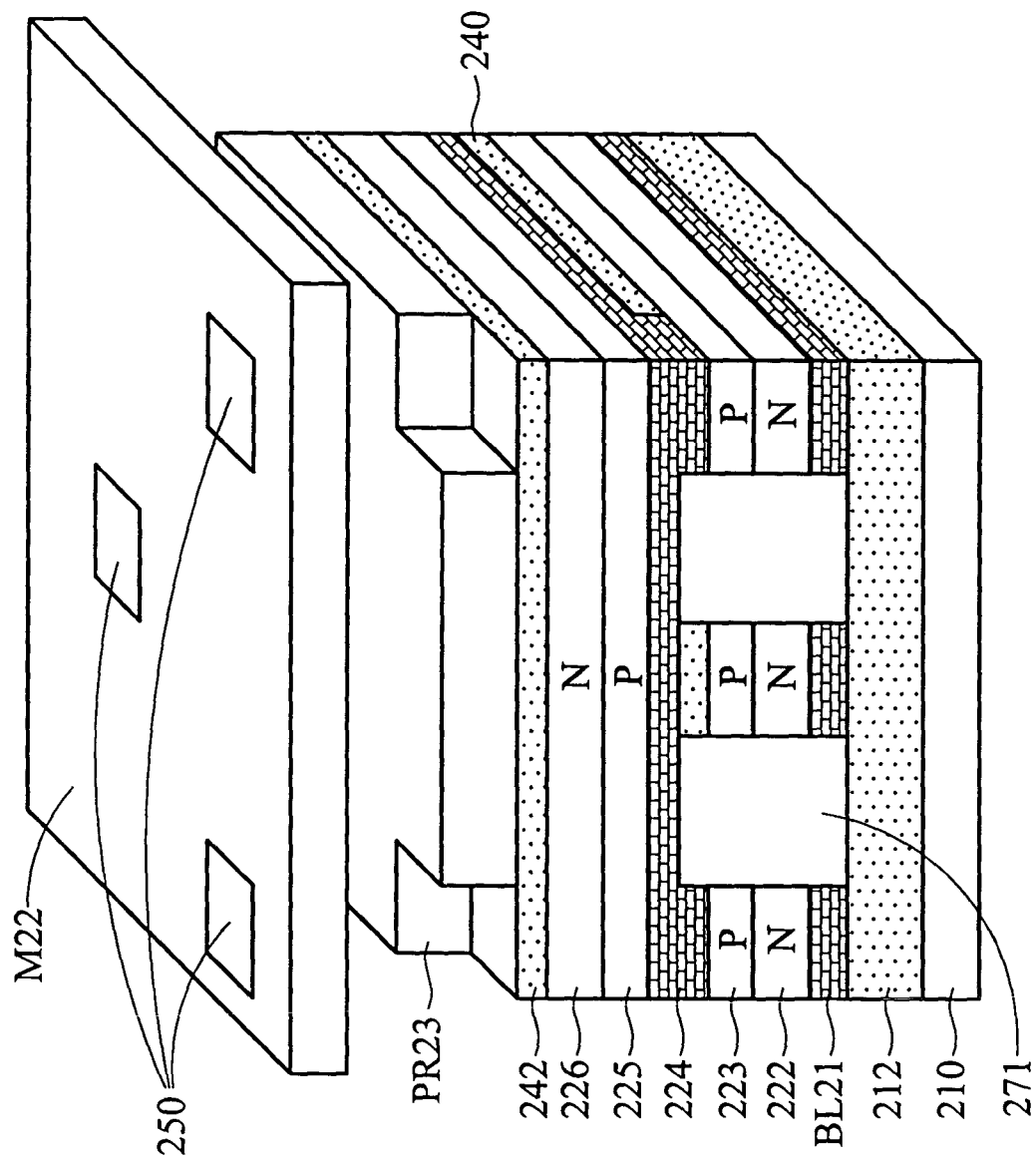
Figure 3G:
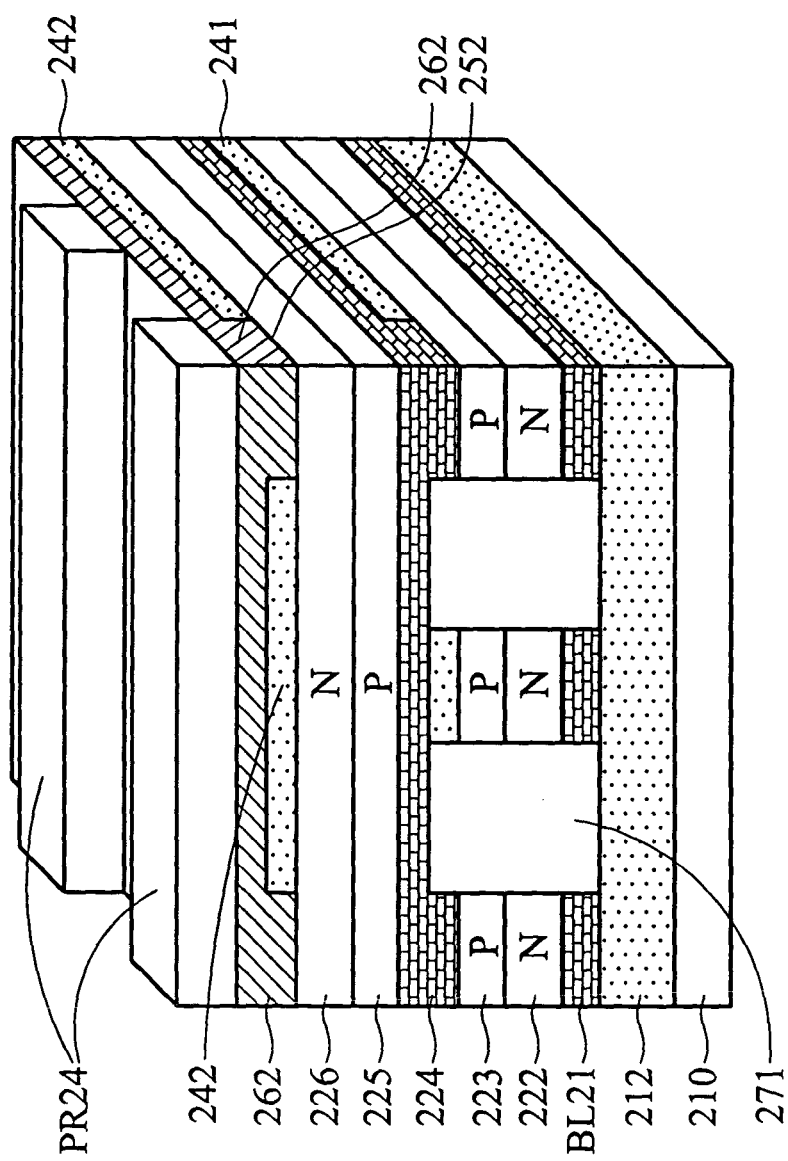
Figure 3H:
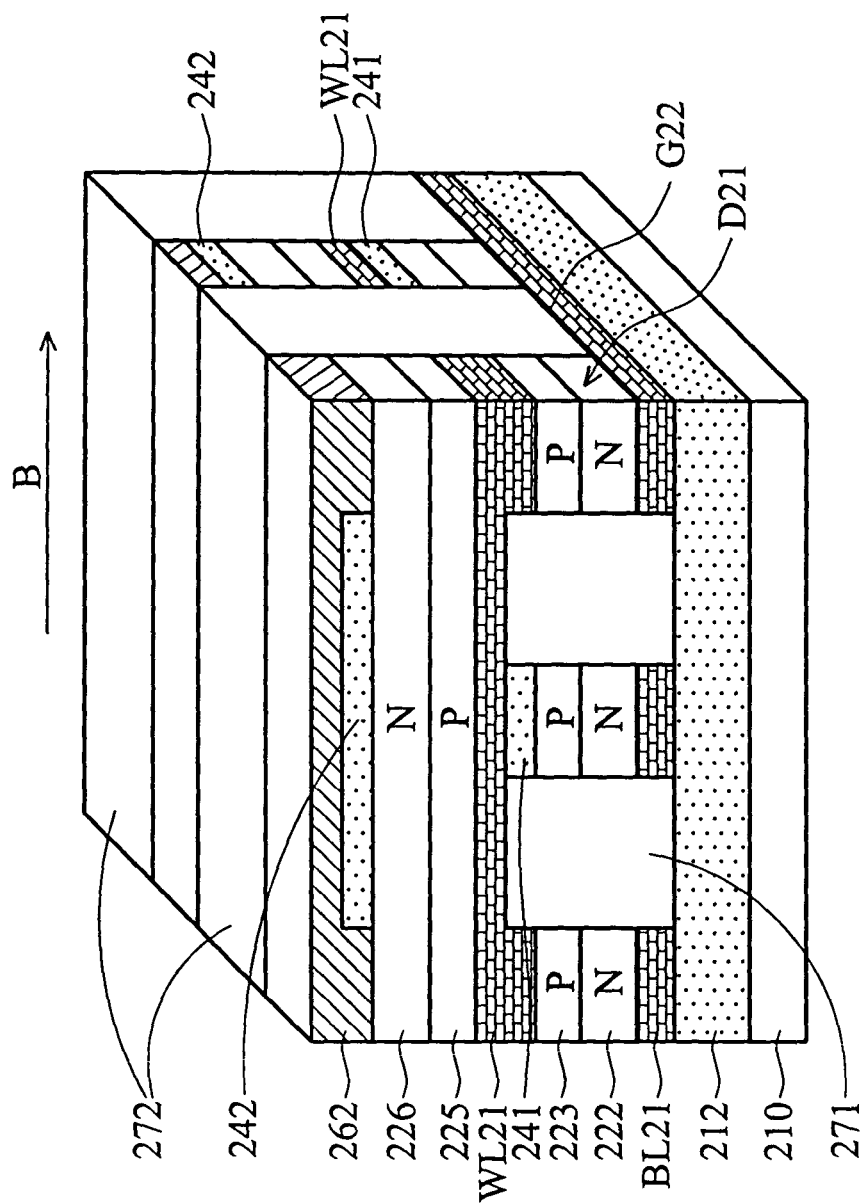
Figure 3I:
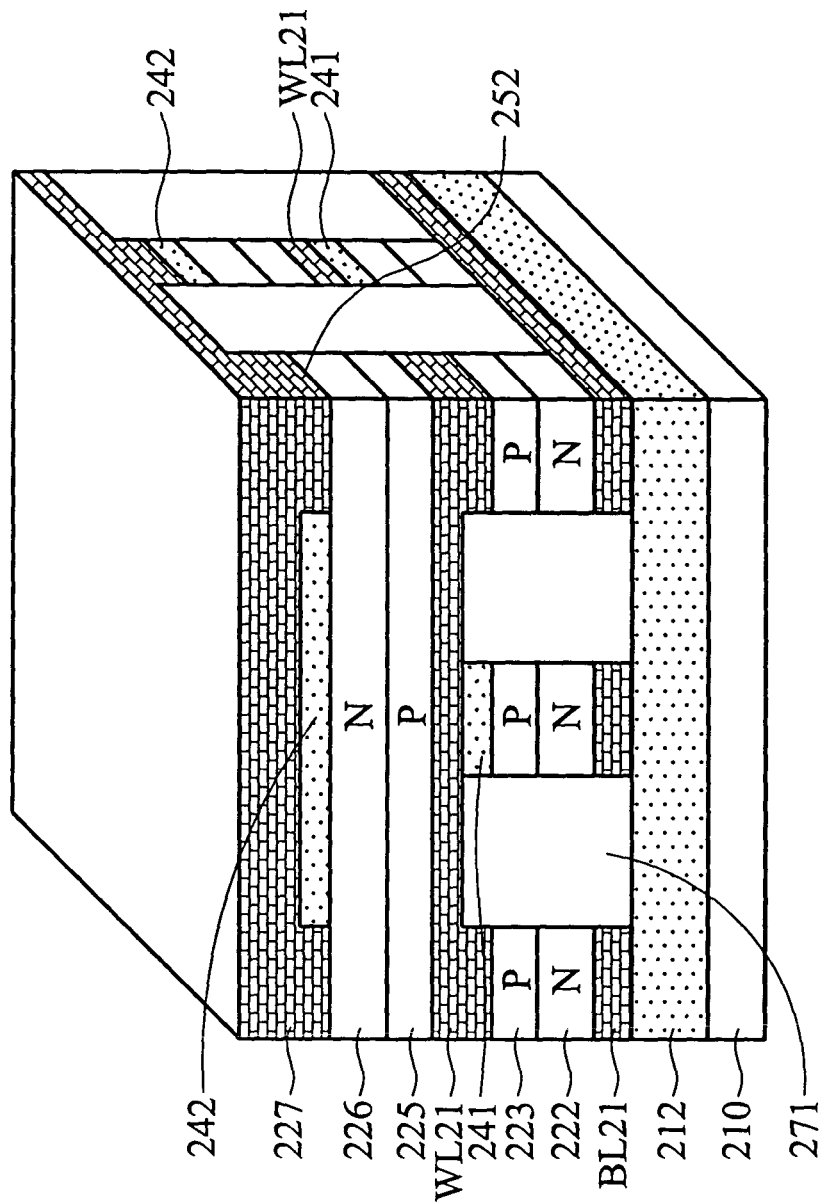
Figure 3J:
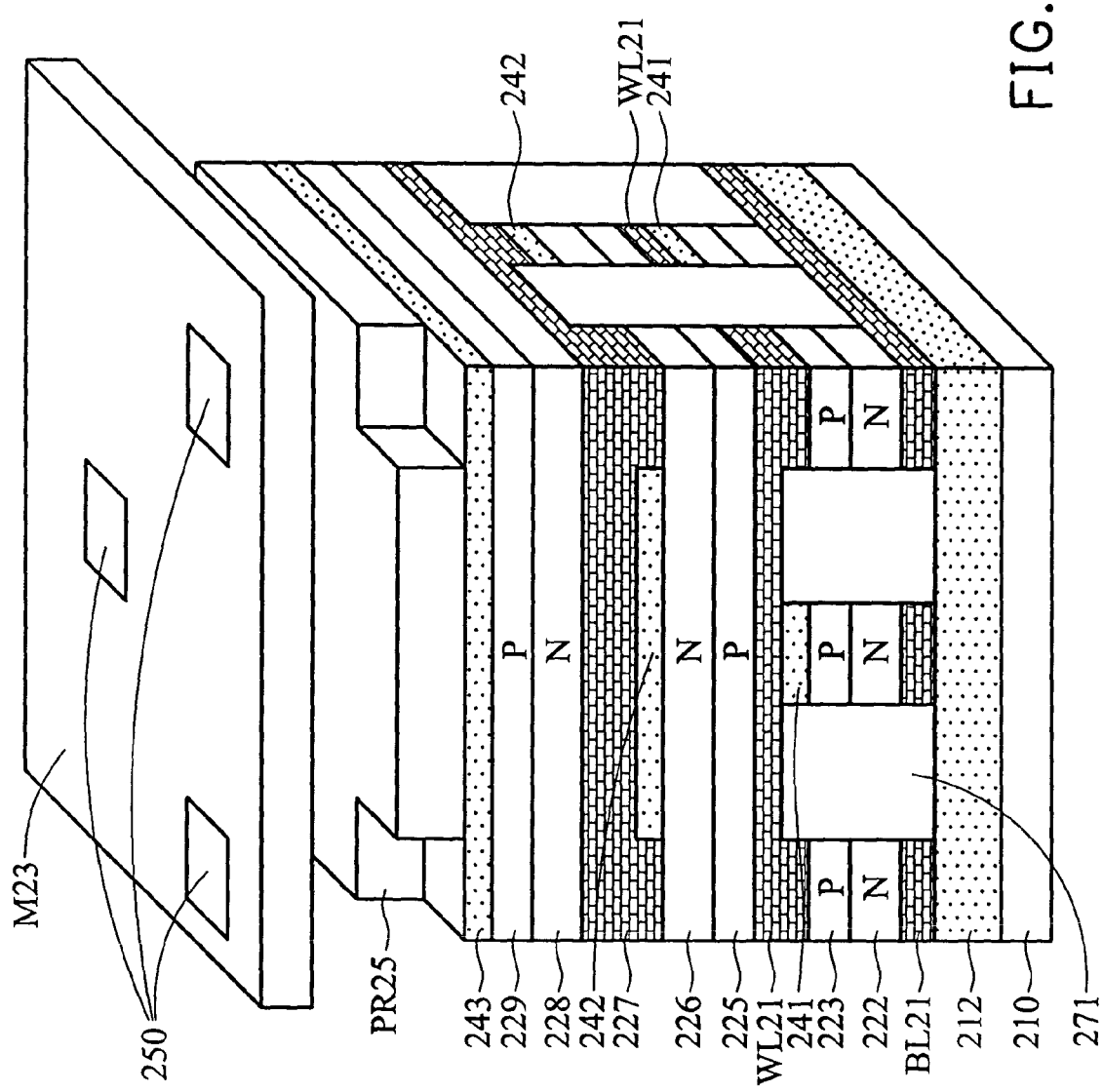
Figure 3K:
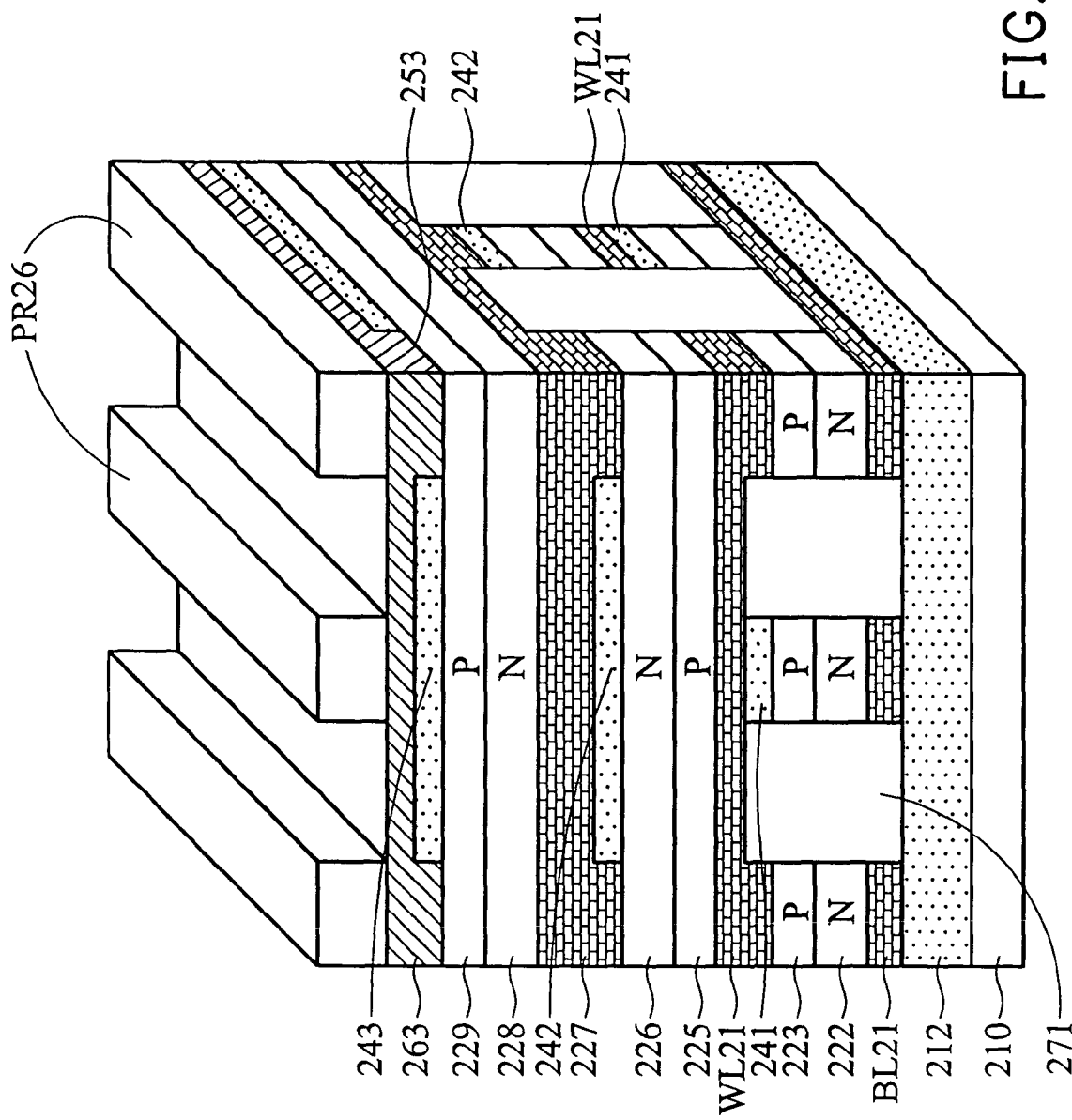
Figure 31:
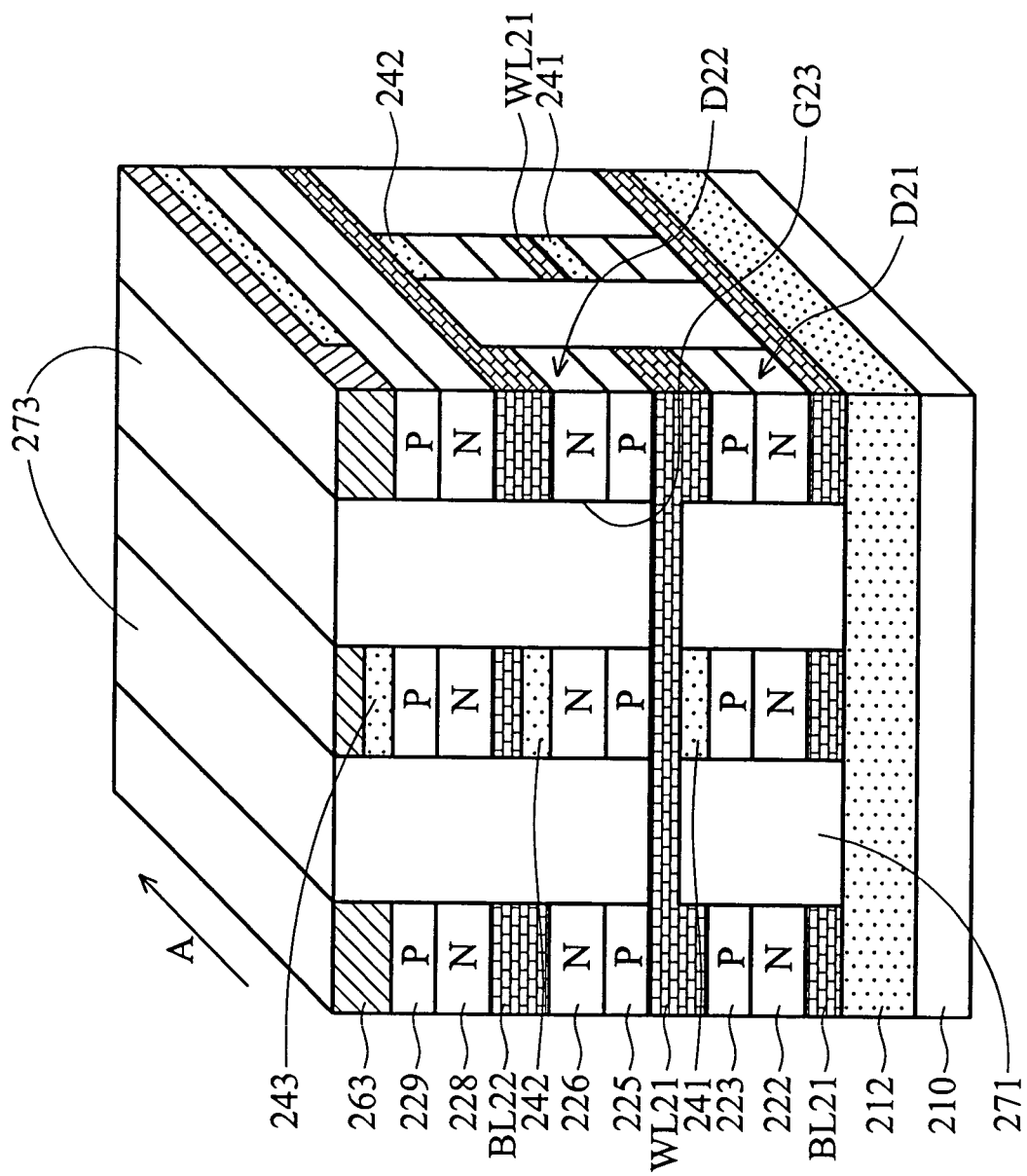
Figure 3M:
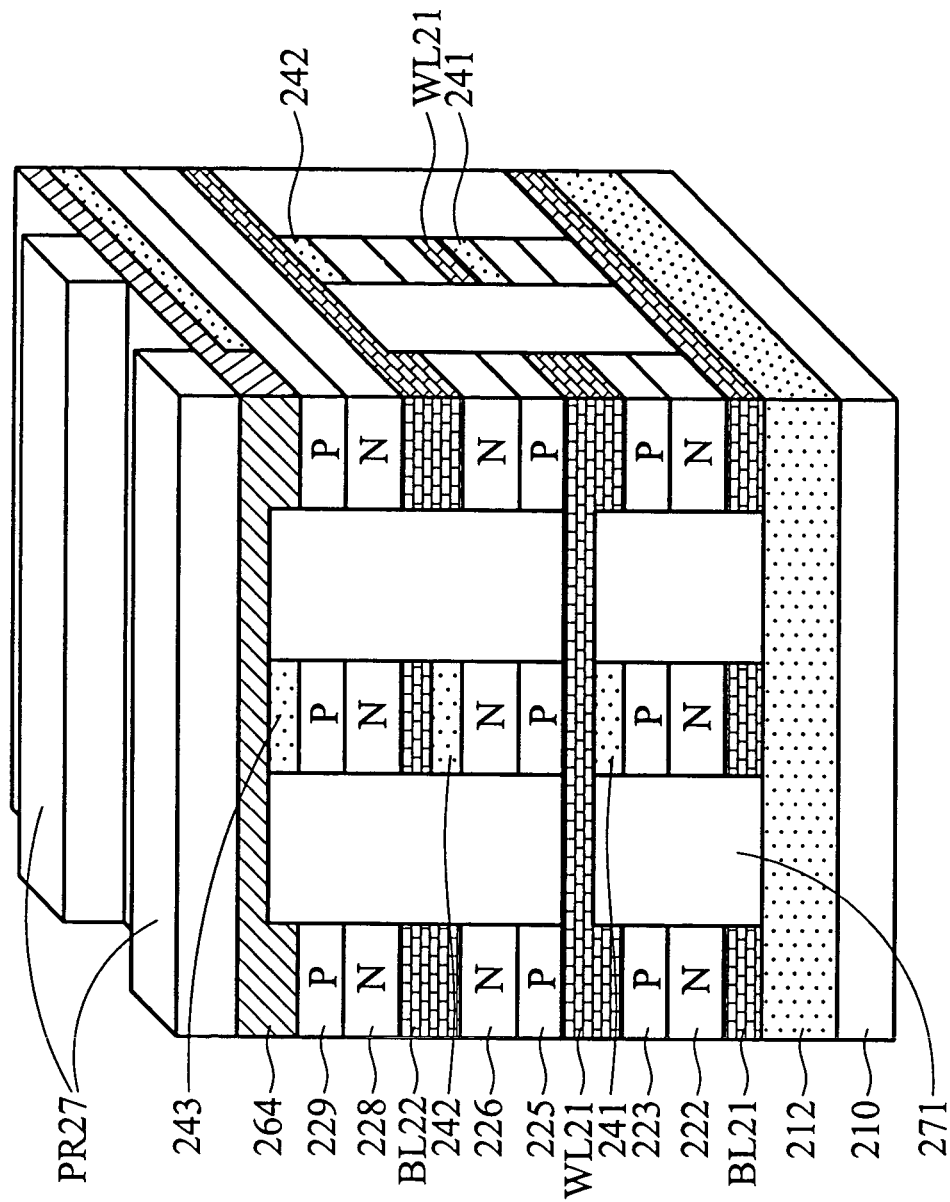
Figure 3N:
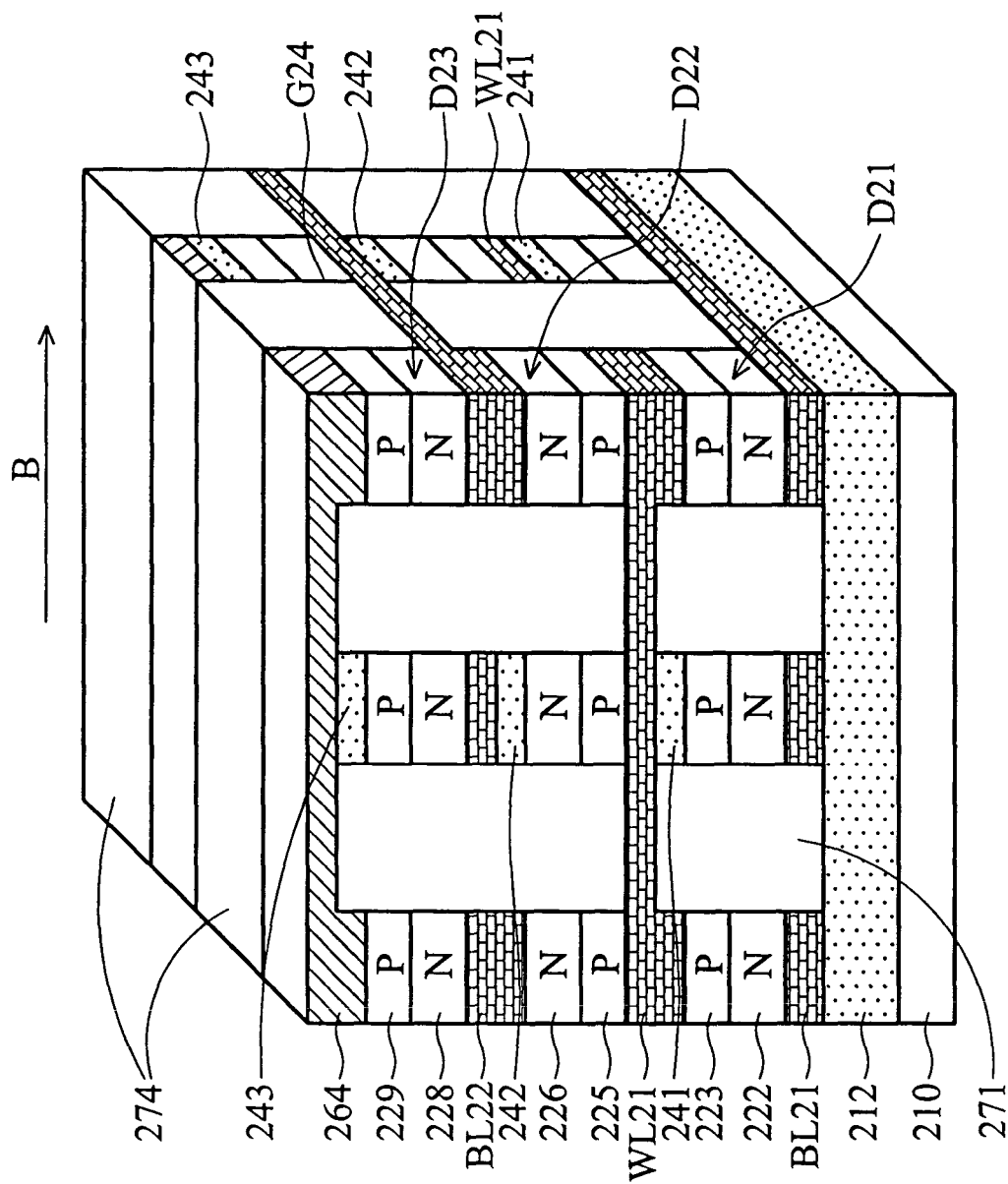
Figure 3O:
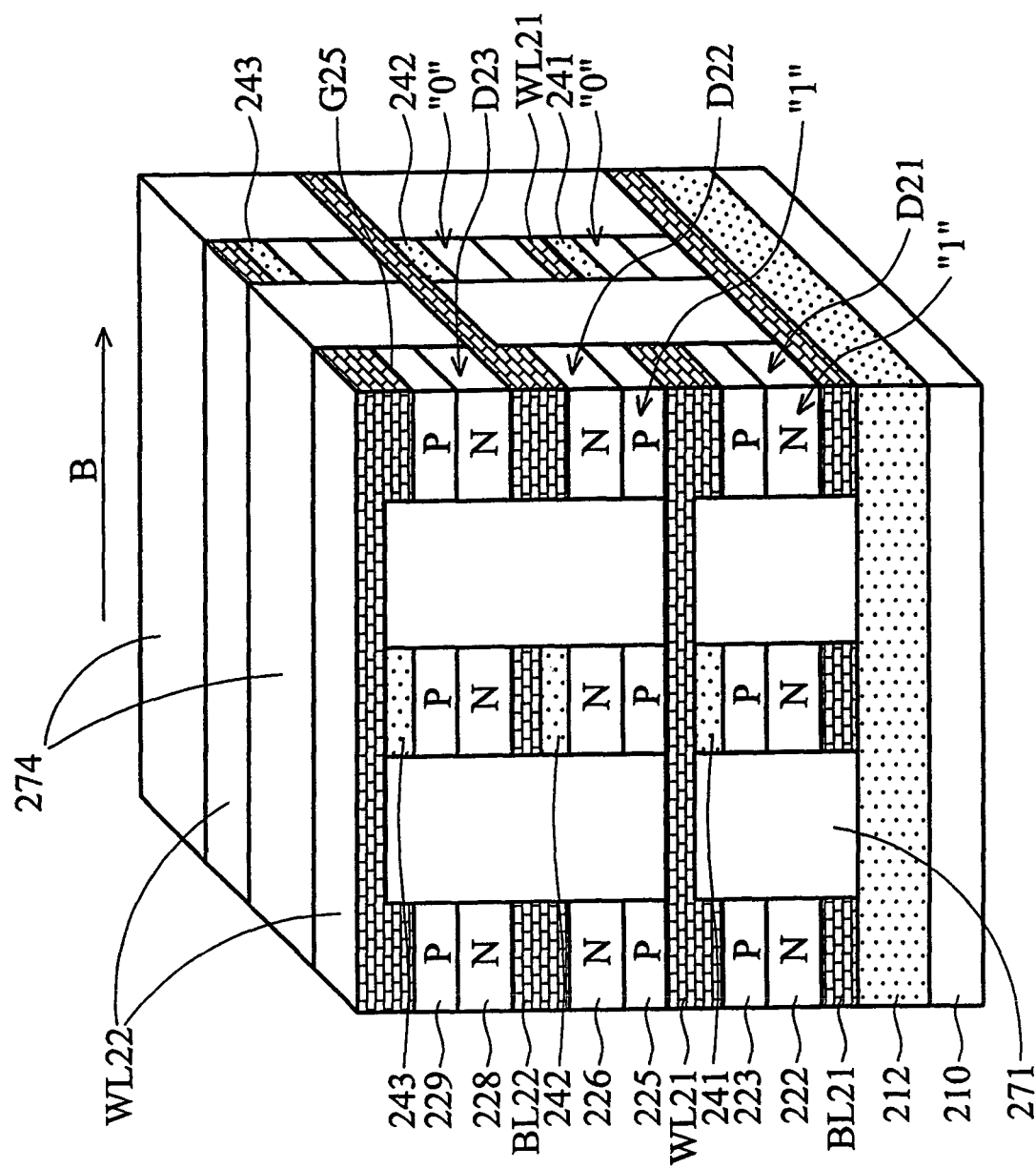

FIG. 3a to 3o are cross-section schematic views showing the manufacturing process of the mask read only memory containing diodes according to another preferred embodiment of the present invention.

Referring to FIG. 3a, an insulating layer 212, a first conductive layer 221, a second conductive layer 222, a third conductive layer 223 and a first dielectric layer 241 are formed on a semiconductor substrate 210 in order. The insulating layer 212 may be silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$). For example, the insulating layer 212 may be silicon dioxide with a thickness of 500 to 800 nm formed by chemical vapor deposition (CVD). The first conductive layer 221 may be polysilicon formed by CVD or metal formed by sputtering, with a thickness of 200 to 400 nm. The first dielectric layer 241 may be silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$). For example, the first dielectric layer 241 may be silicon dioxide formed by CVD, with a thickness of 10 to 300 nm.

A PN junction or Schottky interface is formed between the second conductive layer 222 and the third conductive layers 223. For example, the second conductive layer 222 may be N-type polysilicon formed by CVD or plasma-enhanced CVD (PECVD) and doped with arsenic (As), phosphorus (P), or other N-type dopants, with a thickness of 100 to 600 nm. The third conductive layer 223 may be P-type polysilicon formed by CVD or PECVD and doped with boron (B), gallium (Ga), indium (In), or other P-type dopants, with a thickness of 100 to 400 nm. Thus, a PN junction is formed between the second conductive layer 222 and the third conductive layer 223. Alternatively, the second conductive layer 222 can be P-type polysilicon and the third conductive layer 223 can be metal, so that a Schottky interface is formed therebetween. For convenience, the second conductive layer 222 shown in the figure is represented by N (standing for N-type polysilicon), and the third conductive layer 223 shown in the figure is represented by P (standing for P-type polysilicon).

Referring to FIG. 3b, a first photoresist PR21 is formed and subjected to exposure and development through a ROM code mask M21 for patterning. The openings on the ROM code mask M21 are ROM codes 250.

Next, referring to FIG. 3c, the first dielectric layer 241 at the codes 250 is etched using the first patterned photoresist PR21 as a mask to expose the third conductive layer 223 at the codes 250 to form a plurality of openings for coding 251. The etching may be RIE.

Next, referring to FIG. 3c, the first patterned photoresist PR21 is removed and a first shielding layer 261 (such as silicon nitride) is formed and filled into the openings for coding 251. Subsequently, a second photoresist PR22 is formed with a pattern as same as that of bit lines to be formed.

Next, referring to FIG. 3d, the first shielding layer 261, the first dielectric layer 241, the third conductive layer 223, the second conductive layer 222 and the first conductive layer 221 are etched by, for example, RIE using the second patterned photoresist PR22 as a mask, and the etching is stopped at the insulating layer 212, thereby forming a plurality of first trenches G21 along a direction A. The first conductive layer 221 is defined as a plurality of first bit lines BL21. Then, a first insulating material 271 is filled into the first trenches G21. Then, the first insulating material is etched back using the first shielding layer 261 as a stop layer.

Next, referring to FIG. 3e, after the first shielding layer 261 is removed, a fourth conductive layer 224 is formed on the surface of the entire substrate and the first openings for coding 251 are filled with the material of the fourth conductive layer 224. The CMP is performed to planarize the fourth conductive layer 224.

Next, referring to FIG. 3f, a fifth conductive layer 225, a sixth conductive layer 226 and a second dielectric layer 242 are formed on the fourth conductive layer 224 in order. A PN junction or Schottky interface between the fifth conductive layer 225 and the sixth conductive layers 226 is formed and the fifth conductive layer 225 and the third conductive layer 223 are of matching conductive type. For example, as shown in the FIG. 3f, both the second conductive layer 222 and the sixth conductive layer 226 are N-type polysilicon, and both the third conductive layer 223 and the fifth conductive layer 225 are P-type polysilicon. The second dielectric layer 242 may be silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$).

Next, still referring to FIG. 3f, a third photoresist PR23 is formed and subjected to exposure and development through a ROM code mask M22 for patterning. The openings on the second ROM code mask M22 are ROM codes 250. As shown in FIG. 3f, the codes on the second ROM code mask M22 are aligned with the codes on the first ROM code mask M21, and, alternatively, they can be disposed randomly without requiring alignment.

Next, referring to FIG. 3g, the second dielectric layer 242 at the codes 250 is etched using the third patterned photoresist PR23 as a mask to expose the sixth conductive layer 226 at the codes 250 to form a plurality of second openings for coding 252. The etching may be RIE.

Next, still referring to FIG. 39, the third patterned photoresist PR23 is removed and a second shielding layer 262 (such as silicon nitride) is formed and filled into the second openings for coding 252. Subsequently, a fourth photoresist PR24 is formed with a pattern as same as that of word lines to be formed.

Next, referring to FIG. 3h, the second shielding layer 262, the second dielectric layer 242, the sixth conductive layer 226, the fifth conductive layer 225, the fourth conductive layer 224, the first dielectric layer 241, the third conductive layer 223, and the second conductive layer 222 are etched by, for example, RIE using the fourth patterned photoresist PR24 as a mask and the etching is stopped at the bit lines BL21, thereby forming a plurality of second trenches G22 along a direction B. Thus, the fourth conductive layer 224 is divided into a plurality of first word lines WL21. At the same time, a first layer of a plurality of diodes D21 comprising the second conductive layer 222 and the third conductive layer 223 are formed.

Next, still referring to FIG. 3h, the patterned fourth photoresist PR24 is removed, and a second insulating material 272 is filled into the second trenches G22. For example, silicon dioxide 272 is formed and filled into the second trenches G22 by HDPCVD. Then, the second insulating material 272 is etched back using the second shielding layer 262 as a stop layer.

Next, referring to FIG. 3i, after the second shielding layer 262 is removed, a seventh conductive layer 227 is formed on the surface of the entire substrate and filled into the second openings for coding 252. Then, the seventh conductive layer 227 is planarized by CMP.

Next, referring to FIG. 3j, an eighth conductive layer 228, a ninth conductive layer 229 and a third dielectric layer 243 are formed on the seventh conductive layer 227 in order. A PN junction or Schottky interface is formed between the eighth and the ninth conductive layers 228 and 229 and the eighth conductive layer 228 and the sixth conductive layer 226 are of matching conductive type. For example, as shown in FIG. 3i, both the sixth conductive layer 226 and the eighth conductive layer 228 are N-type polysilicon, and the ninth conductive layer 229 is P-type polysilicon. The third dielectric layer 243 may be silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$).

Next, still referring to FIG. 3j, a fifth photoresist PR25 is formed and subjected to exposure and development through a third ROM code mask M23 for patterning. The openings on the third ROM code mask M23 are ROM codes 250. As shown in FIG. 3j, the codes on the third ROM code mask M23 are aligned with the codes on the first ROM code mask M21, and, alternatively, they can be disposed randomly without requiring alignment.

Next, referring to FIG. 3k, the third dielectric layer 243 at the codes 250 is etched using the fifth patterned photoresist PR25 as a mask to expose the ninth conductive layer 229 at the codes 250 to form a plurality of third openings for coding 253. The etching may be RIE.

Next, still referring to FIG. 3k, the fifth patterned photoresist PR25 is removed and a third shielding layer 263 (such as silicon nitride) is formed and filled into the third openings for coding 253. Subsequently, a sixth photoresist PR26 is formed with a pattern as same as that of bit lines to be formed.

Next, referring to FIG. 3l, the third shielding layer 263, the third dielectric layer 243, the ninth conductive layer 229, the eighth conductive layer 228, the seventh conductive layer 227, the second dielectric layer 242, the sixth conductive layer 226, and the fifth conductive layer 225 are etched by, for example, RIE using the sixth patterned photoresist PR26 as a mask and the etching is stopped at the word lines WL21, thereby forming a plurality of third trenches G23 along a direction A. Thus, the seventh conductive layer 227 is divided into a plurality of second bit lines BL22. At the same time, a second layer of a plurality of diodes D22 comprising the fifth conductive layer 225 and the sixth conductive layer 226 are formed.

Next, still referring to FIG. 3l, the patterned sixth photoresist PR26 is removed, and a third insulating material 273 is filled into the third trenches G23. For example, silicon dioxide 273 is formed and filled into the third trenches G23 by HDPCVD. Then, the third insulating material 273 is etched back using the third shielding layer 263 as a stop layer.

Next, referring to FIG. 3m, the third shielding layer 263 is removed and a fourth shielding layer 264 (such as silicon nitride) is formed on entire surface of the substrate. Subsequently, a seventh photoresist PR27 is formed with a pattern the same as that of word lines to be formed.

Next, referring to FIG. 3n, the fourth shielding layer 264, the third dielectric layer 243, the ninth conductive layer 229 and the eighth conductive layer 228 are etched by, for example, RIE using the seventh patterned photoresist PR27 as a mask and the etching is stopped at the second bit lines BL22, thereby forming a plurality of fourth trenches G24 along the direction B. Thus, a third layer of a plurality of diodes D23 comprising the eighth conductive layer 228 and the ninth conductive layer 229 are formed.

Next, still referring to FIG. 3n, the patterned seventh photoresist PR27 is removed, and a fourth insulating material 274 is filled into the fourth trenches G24. For example, silicon dioxide 274 is formed and filled into the fourth trenches G24 by HDPCVD. Then, the fourth insulating material 274 is etched back using the fourth shielding layer 264 as a stop layer.

Next, referring to FIG. 3o, the fourth shielding layer 264 is removed to form a plurality of fifth trenches G25 along the direction B, so that the top of the fourth insulating material 274 is higher than that of the third dielectric layer 243.

Next, still referring to FIG. 3o, a tenth conductive layer is filled into the fifth trenches G25 and planarized by CMP to form a plurality of word lines WL22. Accordingly, a mask read only memory containing diodes is accomplished, which has three layers of diodes D21, D22 and D23. As shown in FIG. 3o, the PN diode having the dielectric layer 241, 242, or 243 thereon is defined as logic "0" and the PN diode without a dielectric layer thereon is defined as logic "1". Furthermore, the word lines WL21 are commonly used by the two upper and lower layers of diodes D21 and D22, and the bit lines BL22 are commonly used by the two upper and lower layers of diodes D22 and D23.

Figure 4:
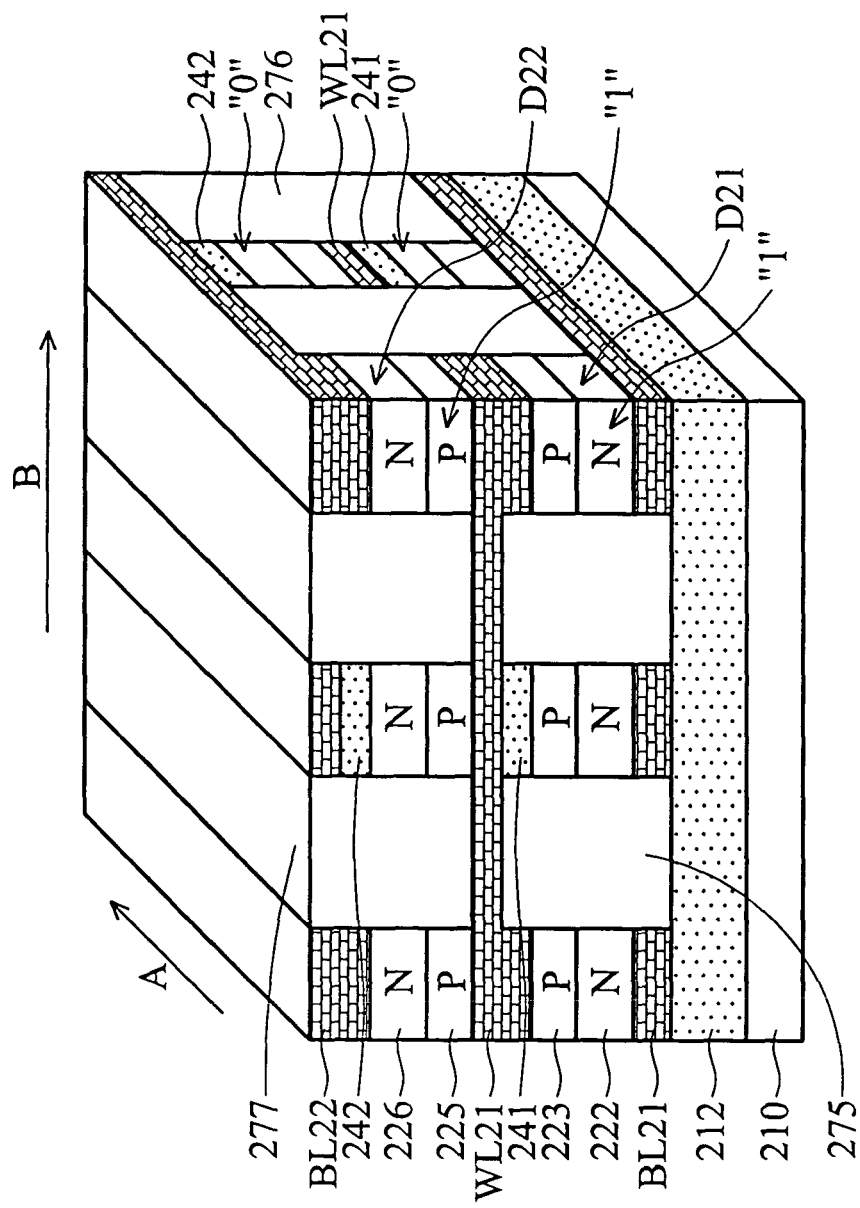
FIG. 4 is a three dimensional schematic view showing the manufacturing process of the mask read only memory containing PN diodes according to another preferred embodiment of the present invention, which contains two PN diode layers.

FIG. 4 shows another mask read only memory containing diodes similar to the structure shown in FIG. 3o and having the same manufacturing method, but only comprising two layers of diodes D21 and D22. The reference numbers in FIG. 4 which are same as those in FIG. 3o represent the same elements. As shown in FIG. 4, the mask read only memory comprises a semiconductor substrate 210; an insulating layer 212 on the semiconductor substrate 210; and two PN diode layers stacked on the insulating layer 212. Each PN diode layer comprises a plurality of vertical PN diodes and a plurality of dielectric layers disposed on part of the PN diodes. As shown in FIG. 4, the first PN diode layer comprises a plurality of vertical PN diodes D21 and a plurality of dielectric layers 241 disposed on part of the PN diodes D21, and the second PN diode layer comprises a plurality of vertical PN diodes D22 and a plurality of dielectric layers 242 disposed on part of the PN diodes D22. The reference numbers 275, 276, and 277 represent insulating material.

Furthermore, as shown in FIG. 4, there are three parallel conductive layers, bit lines BL21 between the lower layer of PN diodes D21 and the insulating layer 212, word lines WL21 between two PN diode layers, and bit lines BL22 on the upper layer of PN diodes D22. The bit lines BL21 and BL22 are disposed in the same direction, while the word lines WL21 are disposed in a direction perpendicular to the direction of the bit lines. Moreover, the two upper and lower PN diode layers are disposed opposite to one another so that two sides of matching conductive type face each other. For example, as shown in FIG. 4, the third conductive layer 223 of the diode D21 at the lower layer and the fifth conductive layer 225 of the diode D22 at the upper layer are both P-type. The PN diode having a dielectric layer thereon is defined as logic "0" and the PN diode without a dielectric layer thereon is defined as logic "1". For example, as shown in FIG. 4, with respect to the lower layer, the PN diode D21 having the first dielectric layer 241 thereon is defined as logic "0" and the PN diode D21 without the first dielectric layer 241 thereon is defined as logic "1". with respect to the upper layer, the PN diode D22 having the second dielectric layer 242 thereon is defined as logic "0" and the PN diode D22 without the second dielectric layer 242 thereon is defined as logic "1". Moreover, word lines WL21 are commonly used by the two upper and lower layers of diodes D21 and D22.

In conclusion, the mask read only memory containing diodes of the present invention can code logic "0" or "1" depending on whether there is a dielectric layer on the diodes or not, and the diodes can be stacked in a plurality of layers to form a high-density three-dimensional array.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A mask read only memory containing diodes, comprising:
    a semiconductor substrate;
    an insulating layer on the semiconductor substrate;
    at least two memory cell layers stacked on the insulating layer, each memory cell layer including:
        a first conductive line along a first direction on the insulating layer;
        a vertical diode on the first conductive line;
        a dielectric layer on the vertical diode; and
        a second conductive line along a second direction on the dielectric layer and the vertical diode,
    wherein the first direction is perpendicular to the second direction and a separating layer is disposed between two stacked adjacent memory cell layers.

2. The mask read only memory containing diodes as claimed in claim 1, wherein the vertical diodes are PN diodes.

3. The mask read only memory containing diodes as claimed in claim 1, wherein the insulating layer is silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$).

4. The mask read only memory containing diodes as claimed in claim 1, wherein the first conductive lines are bit lines and the second conductive lines are word lines.

5. The mask read only memory containing diodes as claimed in claim 1, wherein the dielectric layers are silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$).

6. The mask read only memory containing diodes as claimed in claim 1, wherein each vertical diode comprises two polysilicon layers of opposing conductive types and any two adjacent polysilicon layers of two adjacent memory cell layers have opposing conductive types.

7. The mask read only memory containing diodes as claimed in claim 1, comprising 2 to 10 memory cell layers.

8. The mask read only memory containing diodes as claimed in claim 1, wherein the separating layer is silicon dioxide, aluminum oxide ($Al_2O_3$), silicon nitride ($Si_3N_4$), tantalum pentoxide ($Ta_2O_5$), barium strontium titanate (BST), hafnium oxide ($HfO_2$), or titanium dioxide ($TiO_2$).

9. The mask read only memory containing diodes as claimed in claim 2, wherein the PN diodes comprise two polysilicon layers of opposing conductive types.

10. A mask read only memory containing diodes, comprising:
   a semiconductor substrate;
   an insulating layer on the semiconductor substrate;
   n diode layers stacked on the insulating layer, wherein n is an integer equal to or greater than 2 and each diode layer comprises a plurality of vertical diodes and a plurality of dielectric layers on part of the diodes;
   n parallel first conductive layers;
   n parallel second conductive layers, wherein each diode layer and each dielectric layer are disposed between one of the first conductive layer and one of the second conductive layer; and
   n-1 separating layers disposed between one of the first conductive layers and one of the second conductive layers which are adjacent and stacked.

11. The mask read only memory containing diodes as claimed in claim 10, wherein n is between 2 and 10.

12. A mask read only memory containing diodes, comprising:
   a semiconductor substrate;
   an insulating layer on the semiconductor substrate;
   a plurality of first conductive lines along a first direction on the insulating layer;
   first and second vertical diodes on the first conductive lines;
   a plurality of dielectric layers directly on the first vertical diodes;
   a plurality of second conductive lines along a second direction directly on the dielectric layers and the second vertical diodes, wherein the first direction is perpendicular to the second direction; and
   a separating layer disposed on the second conductive line.

* * * * *